US007579545B2

(12) United States Patent
Tamura et al.

(10) Patent No.: US 7,579,545 B2
(45) Date of Patent: Aug. 25, 2009

(54) APPARATUS AND METHOD FOR SYNTHESIZING A PLURALITY OF WAVEFORMS IN SYNCHRONIZED MANNER

(75) Inventors: Motoichi Tamura, Hamamatsu (JP); Yasuyuki Umeyama, Hamamatsu (JP)

(73) Assignee: Yamaha Corporation, Hamamatsu-Shi (JP)

( * ) Notice: Subject to any disclaimer, the term of this patent is extended or adjusted under 35 U.S.C. 154(b) by 144 days.

(21) Appl. No.: 11/860,464

(22) Filed: Sep. 24, 2007

(65) Prior Publication Data

US 2009/0025537 A1 Jan. 29, 2009

Related U.S. Application Data

(63) Continuation of application No. 10/241,679, filed on Sep. 11, 2002, now abandoned.

(30) Foreign Application Priority Data

Sep. 13, 2001 (JP) ............................ 2001-277994
Dec. 7, 2001 (JP) ............................ 2001-374014

(51) Int. Cl.
*G10H 1/00* (2006.01)
*G10H 7/00* (2006.01)
*G11C 1/00* (2006.01)

(52) U.S. Cl. ........................................................ 84/605

(58) Field of Classification Search ........... 84/604-606, 84/662

See application file for complete search history.

(56) References Cited

U.S. PATENT DOCUMENTS

| | | | |
|---|---|---|---|
| 4,416,180 | A | 11/1983 | Ichigaya |
| 5,218,156 | A | 6/1993 | IIzuka et al. |
| 5,300,724 | A | 4/1994 | Medovich |
| 5,340,938 | A | 8/1994 | Sugita et al. |
| 5,744,741 | A | 4/1998 | Nakajima |
| 6,235,980 | B1 | 5/2001 | Sato |
| 6,365,818 | B1 | 4/2002 | Suzuki |
| 6,584,442 | B1 | 6/2003 | Suzuki et al. |
| 6,687,674 | B2 | 2/2004 | Suzuki et al. |

FOREIGN PATENT DOCUMENTS

| | | |
|---|---|---|
| EP | 1 087 369 | 3/2001 |
| JP | 08-314463 | 11/1996 |
| JP | 2000-047667 | 2/2000 |
| JP | 2000-276174 | 10/2000 |
| JP | 2001-100756 | 4/2001 |

*Primary Examiner*—Jeffrey Donels
(74) *Attorney, Agent, or Firm*—Morrison & Foerster LLP

(57) ABSTRACT

A plurality of blocks of waveform data are stored in a memory, which also stores, for each of the blocks, synchronizing information representative of a plurality of cycle synchronizing points that are indicative of periodic specific phase positions where the block of waveform data should be synchronized in phase with another block of waveform data. Two blocks of waveform data (e.g., harmonic and nonharmonic components) are read out from the memory, along with the synchronizing information. On the basis of the synchronizing information, the readout of two blocks of waveform data is controlled using the synchronizing information. There is stored, for each of the blocks, at least one piece of synchronizing position information indicative of a specific position where the block should be synchronized with another block, and the readout of the individual blocks of waveform data is controlled so that the blocks are synchronized with each other using the synchronizing position information.

20 Claims, 7 Drawing Sheets

APPARATUS AND METHOD FOR SYNTHESIZING A PLURALITY OF WAVEFORMS IN SYNCHRONIZED MANNER

CROSS-REFERENCE TO RELATED APPLICATIONS

This application is a continuation of U.S. patent application Ser. No. 10/241,679 filed Sep. 11, 2002, the entire disclosure of which is incorporated herein by reference.

BACKGROUND OF THE INVENTION

The present invention relates generally to apparatus and methods for producing waveforms of musical tones, voices or other desired sounds on the basis of waveform data read out from a waveform memory or the like, and more particularly to an improved waveform producing apparatus and method capable of producing waveforms that faithfully represent tone color variations effected by a human player using various styles of rendition or various kinds of articulation unique to a particular natural musical instrument. It should be appreciated that the basic principles of the present invention can be applied extensively to various types of equipment, apparatus and methods having the function of generating musical tones, voices or any other desired sounds, such as automatic performance devices, computers, electronic game devices and multimedia-related devices, not to mention electronic musical instruments. Also, let it be assumed that the terms "tone waveform" used in this specification are not necessarily limited to a waveform of a musical tone alone and are used in a much broader sense that may embrace a waveform of a voice or any other desired type of sound.

The so-called "waveform memory readout" technique has already been well known and popularly used in the art, which prestores waveform data coded with a desired coding scheme, such as the PCM (Pulse Code Modulation), DPCM (Differential Pulse Code Modulation) or ADPCM (Adaptive Differential Pulse Code Modulation), and then reads out the thus-prestored waveform data at a rate corresponding to a desired tone pitch to thereby produce a tone waveform. So far, various types of "waveform memory readout" techniques have been proposed and known in the art, most of which are directed to producing a waveform covering from the start to end of a tone to be audibly reproduced or sounded. As one specific example of the waveform memory readout technique, there has been known a scheme of prestoring waveform data of a complete waveform of a tone covering from the start to end thereof. As another example of the waveform memory readout technique, there has been known a scheme of prestoring waveform data of a complete waveform only for each nonsteady state portion, such as an attach, release or joint portion, of a tone presenting relatively complex variations and prestoring a predetermined loop waveform for each steady state portion, such as a sustain portion, of the tone presenting much less variations. It should be noted that, in this patent specification, the terms "loop waveform" are used to refer to a waveform to be read out repeatedly, i.e., in a "looped" fashion.

With the conventional waveform memory readout scheme of prestoring waveform data of a complete waveform of a tone covering from the start to end thereof or prestoring waveform data of a complete waveform only for a particular portion, such as an attach portion, of a tone, however, it has been necessary to prestore a great number of various waveform data corresponding to a variety of styles of rendition (or various kinds of articulation), which would thus undesirably require a memory of an extremely large storage capacity if such a great number of various waveform data are to be stored in the memory as they are. To address this inconvenience, it has been conventional to divide an input waveform into a harmonic component (or periodic component) having periodic waveform components and a nonharmonic component (or nonperiodic component) having nonperiodic waveform components and then store waveform data of the thus-divided components in compressed form, so as to effectively save the memory storage capacity necessary for storing the waveform data. It has also been conventional to save the memory storage capacity necessary for the waveform data by using, for a plurality of tone pitches, same waveform data stored on the basis of an input waveform corresponding to a given tone pitch; specifically, in this case, the waveform data stored on the basis of the input waveform corresponding to a given tone pitch are used after having been shifted to a desired tone pitch.

However, if waveform synthesis is performed, using such waveform data divided into the harmonic and nonharmonic components, with phase differences caused between the harmonic and nonharmonic components, then there would be produced a low-quality waveform with tone color deterioration, undesired noise, etc. In such a case, it is impossible to faithfully express tone color variations effected using various styles of rendition (or various kinds of articulation) unique to a particular natural musical instrument. For example, in the case where waveform data stored in a memory of a limited storage capacity are used after a pitch shift operation (i.e., where the stored waveform data are read out in correspondence with a desired pitch), the conventionally-known waveform memory readout technique performs pitch shift control of the waveform data of the harmonic component alone and does not performs the pitch shift control of the waveform data of the nonharmonic component. With the pitch shift control thus performed only on the harmonic component's waveform data, waveform synthesis is likely to be performed with phase differences caused between the harmonic and nonharmonic components' waveform data. Besides, the conventionally-known waveform memory readout technique is not arranged to synthesize or combine together waveforms while synthesizing the respective phases of the harmonic and nonharmonic components' waveform data. Therefore, particularly in the case where a new waveform is to be produced using waveform data having been subjected to pitch shift control, the waveform tends to be produced with tone color deterioration, undesired noise, etc., and thus the conventional technique can not produce high-quality waveforms, corresponding to various styles of rendition (various kinds of articulation), in such a manner that the produced waveforms will be reproduced with good reproducibility.

Further, when waveform synthesis is to be performed by combining desired waveform blocks stored in a memory, the conventionally-known waveform memory readout technique interconnects the waveform blocks by cross-fade synthesis between respective loop waveform segments of the blocks. However, unless the respective loop waveform segments of the waveform blocks are in phase with each other, they would undesirably cancel each other so that the cross-fade synthesis between the loop waveform segments can not be performed appropriately. Thus, it has been customary to make appropriate phase adjustment such that the phases of the loop waveform segments of the two successive (preceding and succeeding) waveform blocks match each other. Depending on the phase adjustment made, the readout start timing of the harmonic component in the waveform blocks would be changed (delayed) by an amount corresponding to one cycle of the loop waveforms at the maximum, while the readout start timing of the corresponding nonharmonic component in the waveform blocks is left unchanged because no cross-fade synthesis is performed on the nonharmonic component. Thus, in such a case, the readout start timing of the harmonic and nonharmonic components in the waveform blocks does not appropriately coincide with each other, which results in a difference in synthesis timing between the harmonic component's waveform data and the nonharmonic component's waveform data.

SUMMARY OF THE INVENTION

In view of the foregoing, it is an object of the present invention to provide an improved waveform producing apparatus and method capable of producing high-quality waveforms corresponding to various styles of rendition (or various kinds of articulation), by synthesizing waveforms of harmonic and nonharmonic components while synchronizing the respective phases of these harmonic and nonharmonic components' waveforms on a periodic basis.

It is another object of the present invention to provide an improved waveform producing apparatus and method capable of producing high-quality waveforms corresponding to various styles of rendition (or various kinds of articulation), by synthesizing waveforms of harmonic and nonharmonic components while phase-synchronizing the harmonic and nonharmonic components' waveforms at predetermined readout locations within a nonsteady portion, such as an attack, release or joint portion, of each tone that presents complicated waveform variations.

According to one aspect of the present invention, there is provided a waveform producing apparatus which comprises: a storage device storing a plurality of sets of waveform data to be read out along a time axis, said storage device also storing, for each one of the sets of waveform data, synchronizing information representative of a plurality of cycle synchronizing points that are indicative of periodic specific phase positions where the one set of waveform data should be synchronized in phase with another of the sets of waveform data; and a processor coupled with said storage device and adapted to: read out at least two of the sets of waveform data from said storage device; also read out, from said storage device, the synchronizing information stored for each of the at least two sets of waveform data read out from said storage device; and control readout of at least one of the at least two sets of waveform data on the basis of the synchronizing information read out from said storage device in such a manner that respective readout locations of the at least two sets of waveform data are synchronized with each other at least at the specific phase position indicated by the cycle synchronizing point. A tone waveform may be synthesized by combining the at least two sets of waveform data read out from said storage device under control of said processor.

For example, to synthesize a desired waveform by combining together at least two sets of waveform data, the waveform producing apparatus reads out the at least two sets of waveform data from the storage section while synchronizing the at least two sets at each of the specific phase positions preset as the cycle synchronizing points. With this arrangement, the inventive waveform producing apparatus readily achieves phase synchronization between the sets of waveform data, so that it can easily produce high-quality waveforms, having sets of waveform data appropriately synchronized in phase, in correspondence with various styles of rendition (or various kinds of articulation).

According to another aspect of the present invention, there is provided a waveform producing apparatus which comprises: a storage device storing a plurality of blocks of waveform data to be read out along a time axis, said storage device also storing, for each one of the blocks of waveform data, at least one piece of synchronizing position information indicative of a specific position where the one block should be synchronized with another of the blocks; and a processor coupled with said storage device and adapted to: read out at least two of the blocks of waveform data from said storage device in a parallel fashion; also read out, from said storage device, the synchronizing position information stored for each of the at least two blocks read out from said storage device; and control readout of at least one of the at least two blocks of waveform data on the basis of the synchronizing position information read out from said storage device in such a manner that respective readout locations of the at least two blocks of waveform data to be read out in parallel are synchronized with each other at least at the specific position indicated by the read-out synchronizing position information. A tone waveform may be synthesized by combining the at least two blocks of waveform data read out from said storage device under control of said processor.

In this case too, to synthesize a desired waveform, for example, by combining together at least two blocks of waveform data, the waveform producing apparatus controls the readout, by the readout section, of at least one of the at least two blocks of waveform data in such a manner that the at least two blocks of waveform data are synchronized with each other at least at the specific position indicated by the read-out synchronizing position information. With this arrangement, the inventive waveform producing apparatus readily achieves phase synchronization between the blocks of waveform data, and it can produce high-quality waveforms having blocks of waveform data appropriately synchronized in phase. Further, in the present invention, it suffices to only store at least one piece of the synchronizing position information per waveform data block, which can greatly facilitate the waveform production.

According to still another aspect of the present invention, there is provided a waveform producing apparatus which comprises: a storage device storing a plurality of blocks of waveform data, to be read out along a time axis, for each of a harmonic component composed of a periodic waveform component and a nonharmonic component composed of a nonperiodic waveform component, said storage device also storing, for each of the blocks, at least one piece of synchronizing position information indicative of a specific position where respective blocks of the harmonic component and nonharmonic component corresponding to the harmonic component should be synchronized with each other; and a processor coupled with said storage device and adapted to: read out respective blocks of the harmonic component and corresponding nonharmonic component in a parallel fashion; and control readout of the block of waveform data of the nonharmonic component, on the basis of the synchronizing position information for the block of the harmonic component read out from said storage device, in such a manner that a readout location of the block of the nonharmonic component to be read out in parallel to the block of the harmonic component is synchronized with a corresponding readout location of the block of the harmonic component at least at the specific position indicated by the read-out synchronizing position information.

In this case, by, for example, performing control to read out desired blocks of waveform data (e.g., a desired block of the harmonic component as a master block and a corresponding block of the nonharmonic component as a slave block) in such a manner that the blocks are synchronized with each other at least at the specific position indicated by the read-out synchronizing position information, the waveform data of the harmonic component and nonharmonic component can be read out in an appropriately phase-synchronized fashion. Thus, the waveform producing apparatus of the invention can produce tone waveforms etc., presenting style-of-rendition-related characteristics of various performance tones, so that the produced tone waveforms will be reproduced with good reproducibility.

The present invention may be constructed and implemented not only as the apparatus invention as discussed above but also as a method invention. Also, the present invention may be arranged and implemented as a software program for execution by a processor such as a computer or DSP, as well as a storage medium storing such a program. Further, the processor used in the present invention may comprise a dedicated processor with dedicated logic built in hardware, not to mention a computer or other general-purpose type processor capable of running a desired software program.

While the embodiments to be described herein represent the preferred form of the present invention, it is to be understood that various modifications will occur to those skilled in the art without departing from the spirit of the invention. The scope of the present invention is therefore to be determined solely by the appended claims.

BRIEF DESCRIPTION OF THE DRAWINGS

For better understanding of the object and other features of the present invention, its preferred embodiments will be described hereinbelow in greater detail with reference to the accompanying drawings, in which:

FIGS. 8A to 8C are conceptual diagrams explanatory of synchronized readout, in the second embodiment, of the harmonic and nonharmonic components' waveform vector data based on block synchronizing position information, of which FIG. 8A is a diagram schematically showing a body portion and characteristic waveform block segment read out from a waveform database and arranged on a predetermined time axis in accordance with time information, FIG. 8B is a conceptual diagram explanatory of a variation over time of readout locations when the harmonic component's waveform and nonharmonic component's waveform shown in FIG. 8A are read out in accordance with a predetermined pitch, and FIG. 8C is a diagram schematically showing the harmonic and nonharmonic components' waveforms read out in accordance with the respective address progression of FIG. 8B and arranged on a predetermined time axis.

DETAILED DESCRIPTION OF THE EMBODIMENTS

Figure 1:
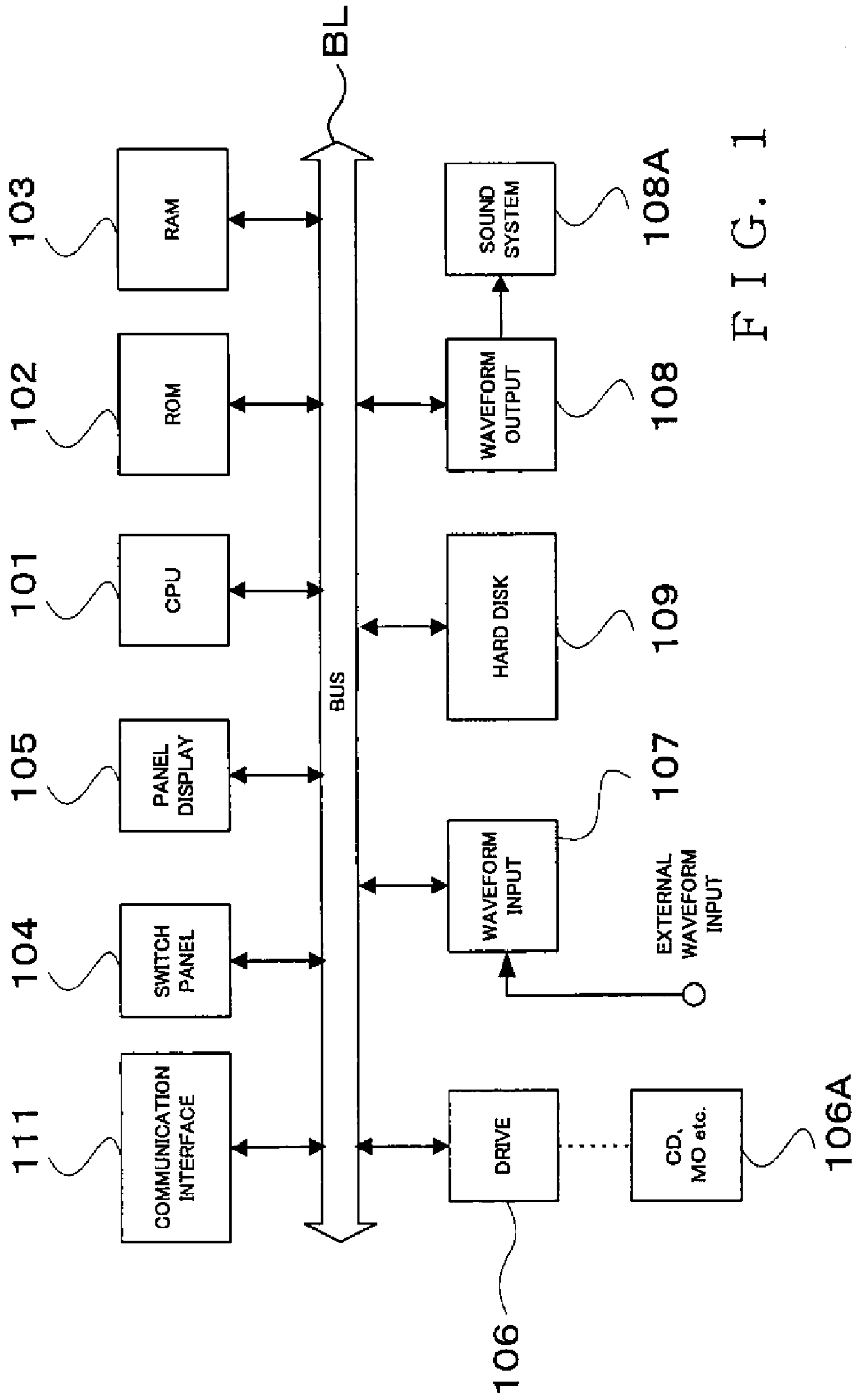
FIG. 1 is a block diagram showing an exemplary hardware organization of a waveform producing apparatus in accordance with an embodiment of the present invention.

FIG. 1 is a block diagram showing an exemplary hardware organization of a waveform producing apparatus in accordance with an embodiment of the present invention. The waveform producing apparatus illustrated here is constructed using a computer, and a predetermined waveform producing process is carried out by the computer executing predetermined waveform producing programs (software). Of course, the waveform producing process may be implemented by microprograms for execution by a DSP (Digital Signal Processor), rather than by such computer software. Also, the waveform producing process of the present invention may be implemented by a dedicated hardware apparatus that includes discrete circuits or integrated or large-scale integrated circuit built therein. Further, the waveform producing apparatus of the present invention may be implemented as an electronic musical instrument, karaoke device, electronic game device or other type of multimedia-related device, personal computer or any other desired form of product. Note that whereas the waveform producing apparatus of the invention may include other hardware components than the above-mentioned, it will be described hereinbelow as using only minimum necessary resources.

In FIG. 1, the waveform producing apparatus in accordance with the embodiment of the present invention includes a CPU (Central Processing Unit) 101 functioning as a main control section of the computer. To the CPU 101 are connected, via a bus (e.g., data and address bus) BL, a ROM (Read-Only Memory) 102, a RAM (Random Access Memory) 103, a switch panel 104, a panel display unit 105, a drive 106, a waveform input section 107, a waveform output section 108, a hard disk 109 and a communication interface 111. The CPU 101 carries out various processes directed to "waveform database creation" (to be later described in relation to FIG. 2), "waveform production" (to be later described in relation to FIGS. 4 and 5) on the basis of predetermined software programs. These programs are supplied, for example, from a network via the communication interface 111 or from an external storage medium 106A, such as a CD or MO (Magneto-Optical disk) installed in the drive 106, and then stored in the hard disk 109. In execution of a desired one of the programs, the desired program is loaded from the hard disk 109 into the RAM 103; in an alternative, the programs may be prestored in the ROM 102.

The ROM 102 stores therein various programs and data to be executed or referred to by the CPU 101. The RAM 103 is used as a working memory for temporarily storing various performance-related information and various data generated as the CPU 101 executes the programs, or as a memory for storing a currently-executed program and data related to the currently-executed program. Predetermined address regions of the RAM 103 are allocated to various functions and used as various registers, flags, tables, memories, etc. The switch panel 104 includes various operators for instructing tone sampling, editing the sampled waveform data, entering various pieces of information, etc. The switch panel 104 may be, for example, in the form of a ten-button keypad for inputting numerical value data, keyboard for inputting character/letter data, or panel switches. The switch panel 104 may also include other operators for selecting, setting and controlling a pitch, color, effect, etc. of each tone to be generated. The panel display unit 105 displays various information input via the switch panel 104, the sampled waveform data, etc. and comprises, for example, a liquid crystal display (LCD), CRT (Cathode Ray Tube) and/or the like.

The waveform input section 107 contains an A/D converter for converting an analog input tone signal, introduced via an external waveform input device such as a microphone, into digital data (waveform data sampling), and inputs the thus-sampled digital waveform data into the RAM 103 or hard disk 109 as original waveform data from which to produce desired waveform data to be used for production of a desired waveform. In the "waveform database creation" process (FIG. 2) carried out by the CPU 101, the thus-input original waveform data are divided into waveform data of harmonic and nonharmonic components, and the thus-divided harmonic and nonharmonic components' waveform data are stored in a waveform database. In the waveform production process of FIGS. 4 and 5, waveform data of each tone signal corresponding to performance information are produced using the harmonic component's waveform data and nonharmonic component's waveform data selectively read out from the waveform database. above-mentioned waveform database. Of course, in the instant embodiment, a plurality of tone signals can be generated simultaneously. The thus-produced waveform data of each tone signal are given via the bus BL to the waveform output section 108 and then stored in a buffer thereof. The waveform output section 108 reads out the buffered waveform data at a predetermined output sampling frequency and then sends the thus read-out waveform data to a sound system 108A after D/A-converting the waveform data. In this way, each tone signal output from the waveform output section 108 is sounded or audibly reproduced via the sound system 108A. Here, the hard disk 109 is provided to store various data to be used for synthesizing waveforms corresponding to various waveform data and styles of rendition, a plurality of kinds of performance-related data such as tone color data composed of various tone color parameters, and data related to control of various programs to be executed by the CPU 101 and the like.

The drive 106 functions to drive a removable disk (external storage medium 106A) that stores thereon various data to be used for synthesizing waveforms corresponding to various waveform data and styles of rendition, a plurality of kinds of performance-related data, such as tone color data composed of various tone color parameters and data related, for example, to control of various programs to be executed by the CPU 101, and/or the like. Note that the external storage medium 106A to be driven by the drive 106 may be any one of various known removable-type media, such as a floppy disk (FD), compact disk (CD-ROM or CD-RW), magneto-optical (MO) disk, digital versatile disk (DVD). or semiconductor memory. Particular stored contents (control program) of the external storage medium 106A set in the drive 106 may be loaded directly into the RAM 103, without being first loaded into the hard disk 109. Note that the approach of supplying a desired program via the external storage medium 106A or via a communication network is very advantageous in that it can greatly facilitate version upgrade of the control program, addition of a new control program, etc.

Further, the communication interface 111 is connected to a communication network, such as a LAN (Local Area Network), the Internet or telephone line network, via which it may be connected to a desired sever computer or the like (not shown) so as to input a control program, waveform data, performance information or the like to the waveform producing apparatus of the invention. Namely, in a case where a particular control program, waveform data or the like is not contained in the ROM 102 or hard disk 109 of the waveform producing apparatus, the control program, waveform data or the like can be downloaded from the server computer via the communication interface 111 to the waveform producing apparatus of the invention. In such a case, the waveform producing apparatus of the invention, which is a "client", sends a command to request the server computer to download the control program, waveform data or the like by way of the communication interface 111 and communication network. In response to the command from the client, the server computer delivers the requested control program, waveform data or the like to the waveform producing apparatus via the communication network. The waveform producing apparatus of the invention receives the control program, waveform data or the like from the server computer via the communication network and communication interface 111 and cumulatively stores the received control program, waveform data or the like into the hard disk 109. In this way, the necessary downloading of the control program, waveform data or the like is completed. It should be obvious that the waveform producing apparatus of the invention may further include a MIDI interface so as to receive MIDI performance information. It should also be obvious that a music-performing keyboard and performance operating equipment may be connected to the bus BL so that performance information can be supplied to the waveform producing apparatus by an actual real-time performance. Of course, an external storage medium 106A containing performance information of a desired music piece may be used to supply the performance information of the desired music piece to the waveform producing apparatus.

Figure 2:
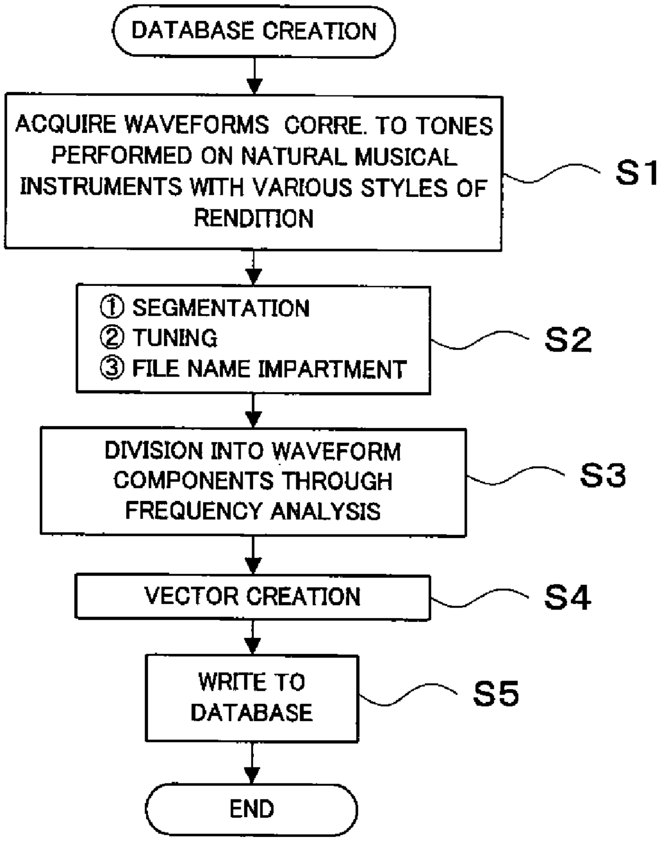
FIG. 2 is a flow chart showing an exemplary operational sequence of a waveform database creation process carried out in the waveform producing apparatus shown in FIG. 1.

FIG. 2 is a flow chart showing an exemplary operational sequence of the waveform database creation process carried out in the above-described waveform producing apparatus of the invention, which is directed to creating waveform data (i.e., vector data) on the basis of waveforms of tones actually performed with various styles of rendition (or various kinds of articulation) in such a manner that the created waveform data correspond to the various styles of rendition (kinds of articulation).

First, at step S1, waveforms are acquired which correspond to tones actually performed on various natural musical instruments with various styles of rendition. Namely, at this step, waveform data of various tones actually performed on various natural musical instruments are acquired via an external waveform input device, such as a microphone, through the waveform input section 107, and the waveform data of these performance tones (i.e., original waveforms) are stored in predetermined areas of the hard disk 109. At next step S2, the thus-acquired original waveforms of each of the performance tones corresponding to the various performance styles unique to the natural musical instruments are segmented every characteristic portion, then subjected to a tuning operation and then given file names. Namely, the acquired original waveform of each of the performance tones is first segmented into partial waveforms (waveform segmentation), each representing a characteristic waveform variation, such as waveforms of nonsteady state portions like an attack-portion waveform, release-portion waveform and joint-portion and waveforms of steady state portions like a body-portion waveform. Then, the pitch of each of the individual segmented partial waveforms, covering one or two or more wave cycles of the tone in question, is identified and modified as necessary (tuning). After that, unique file names are imparted to the segmented waveforms (file name impartment). Then, at step S3, the partial waveforms having been processed at step S2 are divided into waveform components through predetermined frequency analysis. Namely, each of the segmented partial waveforms is subjected to Fast Fourier Transform (FFT) for division into harmonic and nonharmonic components. In addition, characteristics of various waveform factors, such as a pitch and amplitude, are extracted from each of the harmonic and nonharmonic components; here, extraction is made of a "waveform shape" (Timbre) factor representing only extracted characteristics of a waveform shape normalized in pitch and amplitude, a "pitch" factor representing extracted characteristics of a pitch variation from a predetermined reference pitch, and an "amplitude" factor representing extracted characteristics of an amplitude envelope. However, for the nonharmonic component, no pitch factor is extracted because the nonharmonic component has no pitch variation characteristics.

Note that the "joint portion" is a waveform portion interconnecting successive tones (or successive tone portions) with a desired style of rendition.

At next step S4, waveform vector data are created. Namely, for each of the above-mentioned factors, such as the waveform (timbre), pitch and amplitude factors of the divided waveform components (e.g., harmonic and nonharmonic components), a plurality of sample values of successive sample points are extracted dispersedly or, if necessary, consecutively, and each extracted sample value group or train of the successive sample points thus obtained is given a different or unique vector ID (identification information) and stored in memory along with data indicative of a time position thereof. Hereinafter, such sample data are referred to as "vector data". The instant embodiment creates respective vector data of the waveform (timbre) factor, pitch factor and amplitude factor of the harmonic component, and respective vector data of the waveform (timbre) factor and amplitude factor of the nonharmonic component. In the instant embodiment, for creation of a harmonic component's waveform vector data set and nonharmonic component's waveform vector data set, a suitable position is stored as a cycle synchronizing position or point CSP, for each wave cycle of the harmonic component's waveform extracted by the frequency analysis (see FIG. 3), with a view to synchronizing the harmonic component and nonharmonic component as will be later described in detail. The cycle synchronizing points CSP are synchronizing position information to be used for performing waveform synthesis by reading out the harmonic component's waveform vector data set and nonharmonic component's waveform vector data set in such a manner that respective readout locations of these harmonic and nonharmonic components' waveform vector data sets are synchronized on a periodic basis; specifically, predetermined addresses or the like are stored as such cycle synchronizing points CSP. At next step S5, the vector data sets of the various factors of the components, having been created in the above-described manner, are cumulatively written into a waveform database provided in the hard disk 9 or the like. Namely, the instant embodiment, instead of fully storing a complete waveform of each of tones performed on various natural musical instruments in various styles of rendition, extracts only partial waveforms (e.g., attack-portion waveform, body-portion waveform, release-portion waveform, joint-portion waveform, etc.) necessary for a waveform shape variation, and then stores the extracted partial waveforms in compressed form using a hierarchical compression scheme that compresses the partial waveforms for each of various hierarchical levels, such as the harmonic/nonharmonic component and factors. By so doing, the instant embodiment can reduce the necessary storage capacity of the hard disk 109 for storing the waveform data.

Now, with reference to FIGS. 3A to 3D, a description will be made about harmonic component's waveform vector data and nonharmonic component's waveform vector data of an input waveform which are created by the waveform database creation process and then stored in the waveform database. Specifically, FIGS. 3A to 3D are conceptual diagrams showing examples of harmonic component's waveform vector data and nonharmonic component's waveform vector data created on the basis of a first embodiment of the synchronizing method. More specifically, FIGS. 3A to 3D show examples of harmonic and nonharmonic components' waveform vector data sets of an attack, body, joint and release portions, respectively, using respective amplitude envelopes of the partial waveforms. Note however that loop waveform segments are shown only schematically in these figures. In each of FIGS. 3A to 3D, the example of the harmonic component's waveform vector data (HW) are shown on an upper row while the example of the nonharmonic component's waveform vector data (NHW) are shown on a lower row.

Figures 3A, 3B, 3C, 3D:
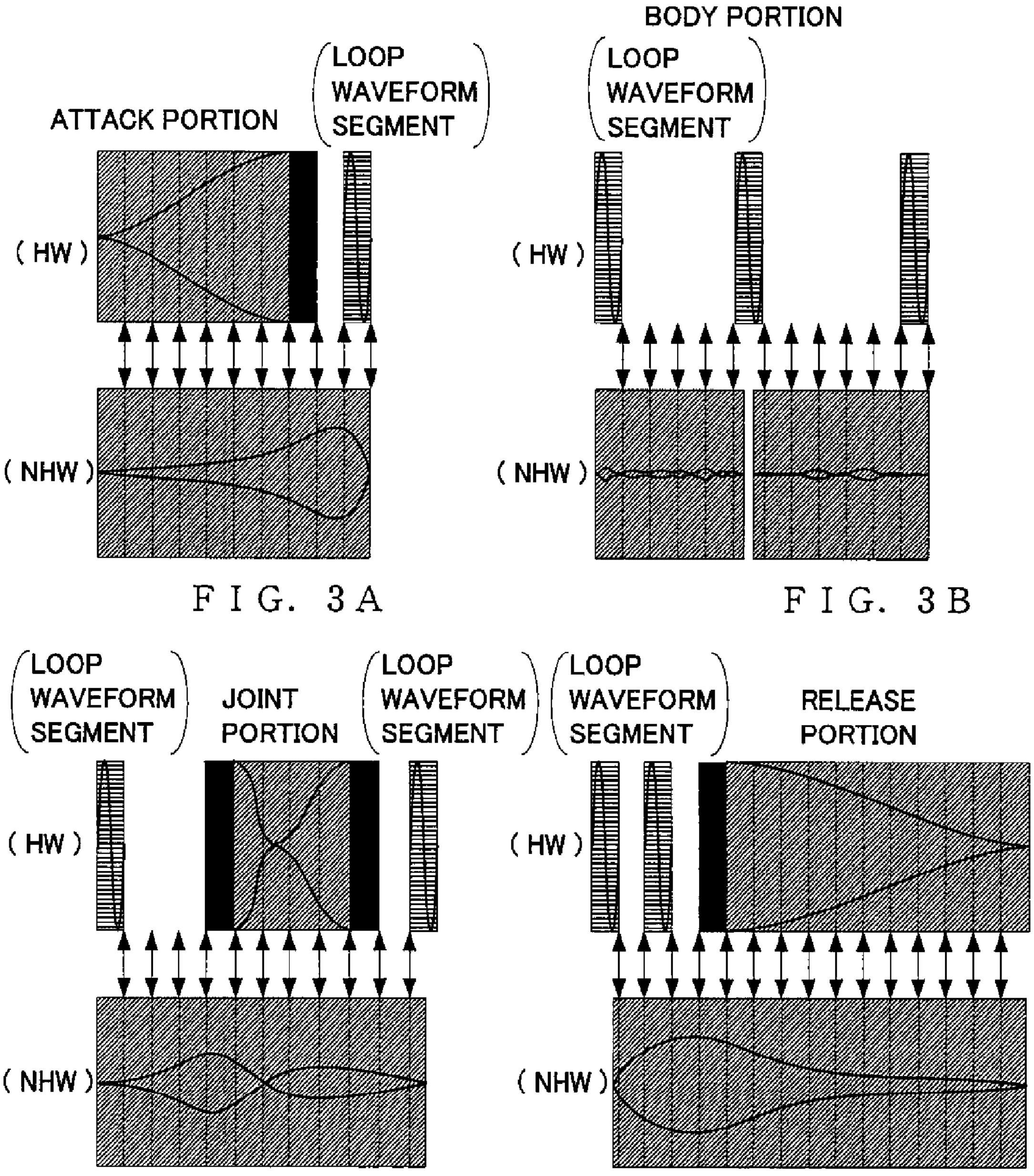
FIGS. 3A to 3D are conceptual diagrams showing examples of harmonic component's waveform vector data and nonharmonic component's waveform vector data created in the embodiment of the present invention.

As shown in FIG. 3A, the harmonic component's waveform vector data (HW) of the attack portion comprise a combination of a characteristic waveform block segment where data indicative of a characteristic waveform shape are stored in succession (hatched part in the figure) and a loop waveform segment that follows the characteristic waveform block segment and that can be read out repeatedly (filled-in-black part in the figure). The characteristic waveform block segment is a high-quality waveform segment (nonloop waveform segment) having characteristics of a style of rendition (or articulation) etc. As illustratively shown in FIG. 3B, the harmonic component's waveform vector data (HW) of the body portion comprise a repeated combination of data of one or a plurality of loop waveform segments. As shown in FIG. 3C, the harmonic component's waveform vector data (HW) of the joint portion comprise a combination of data of a loop waveform segment, a characteristic waveform block segment and a loop waveform segment. Further, as shown in FIG. 3D, the harmonic component's waveform vector data (HW) of the release portion comprise a combination of data of loop waveform segments and a characteristic waveform block segment. Because such an attack portion, body portion, joint portion, release portion, etc. are connected together via the loop waveform segments, one loop waveform segment is positioned before and/or behind the characteristic waveform block segment of each of the attack portion, body portion, joint portion, release portion, etc. Each of the loop waveform segments is a unit waveform element of a relatively monotonous tone portion which consists of one or an appropriate plurality of wave cycles, and the attack, body, joint and release portions can be connected together through repeated readout of such loop waveform segments. The harmonic component's waveform vector data set of the attack portion, body portion, joint portion, release portion, etc. is stored using, as cycle synchronizing points or positions CSP, predetermined positions (denoted by double-head arrows and dotted lines in FIGS. 3A to 3D) corresponding to the waveform cycles.

On the other hand, the nonharmonic component's waveform vector data set (NHW) corresponding to the harmonic component's waveform vector data set (HW) is stored using, as its cycle synchronizing points CSP, predetermined positions (denoted by dotted lines in FIGS. 3A to 3D) corresponding to the cycle synchronizing points CSP of the harmonic component's waveform vector data set. The double-head arrows denoted between the harmonic component's waveform vector data and the nonharmonic component's waveform vector data show, for convenience of illustration, the positions set as the corresponding cycle synchronizing points CSP of both of the harmonic and nonharmonic components' waveform vector data. As noted earlier, the cycle synchronizing points CSP of the harmonic and nonharmonic components' waveform vector data are set at appropriate positions for each of the wave cycles of the harmonic component's waveform obtained through the frequency analysis (see step S3 of FIG. 2) (i.e., at desired phase-synchronizing positions, more specifically, at same appropriate positions as in the input waveform before undergoing the harmonic/nonharmonic component division operation): hereinafter, these positions will be simply called "time positions"). For example, when the harmonic and nonharmonic components' waveform vector data sets are to be synchronized with each other at appropriate positions for each of the waveform cycles, appropriate time positions within each of the waveform cycles are stored as the cycle synchronizing points CSP; alternatively, when the harmonic and nonharmonic components' waveform vector data sets are to be synchronized with each other at appropriate positions for every predetermined plurality of the waveform cycles, appropriate time positions within every such predetermined plurality of the waveform cycles are stored as the cycle synchronizing points CSP. Although the cycle sync point CSP may be set every n (which may be either an integer or decimal) multiple of one wave cycle of the harmonic component's waveform having been subjected to the frequency analysis, it is most preferable that the cycle synchronizing points CSP be set at appropriate positions for each wave cycle of the harmonic component's waveform. More specifically, the harmonic and nonharmonic components' waveform vector data are read out in accordance with predetermined readout addresses, and thus, in practice, the predetermined addresses are stored as the cycle sync points CSP. However, because the characteristic waveform block segment generally has no periodicity, the cycle synchronizing points CSP need not be set in such a characteristic waveform block segment for each wave cycle.

Figure 4:
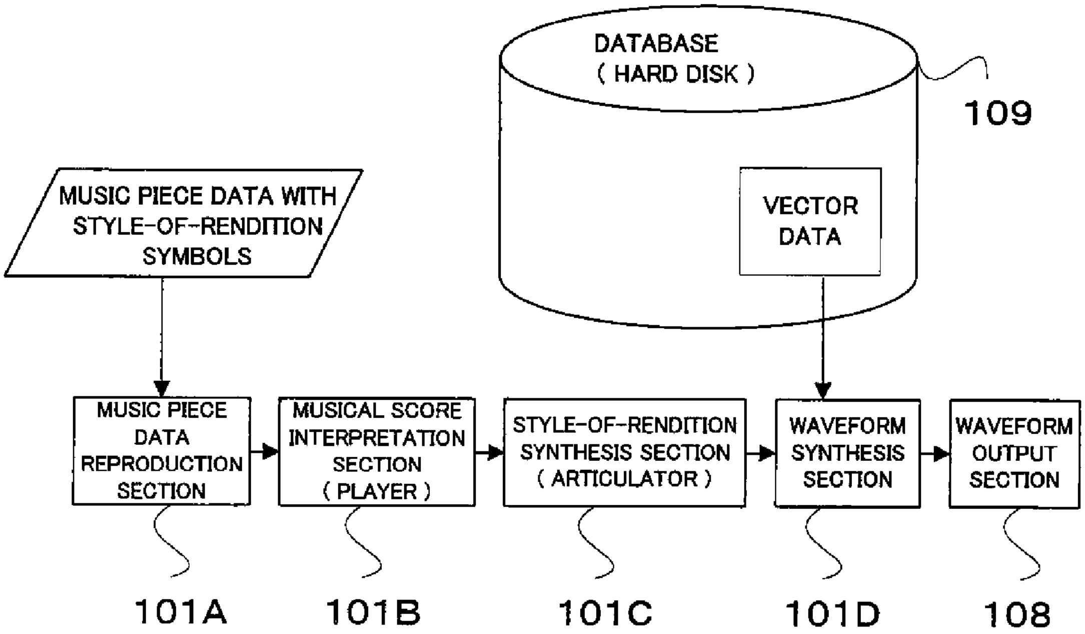
FIG. 4 is a block diagram showing an example of a waveform production process performed by dedicated hardware in the waveform producing apparatus.
Figure 5:
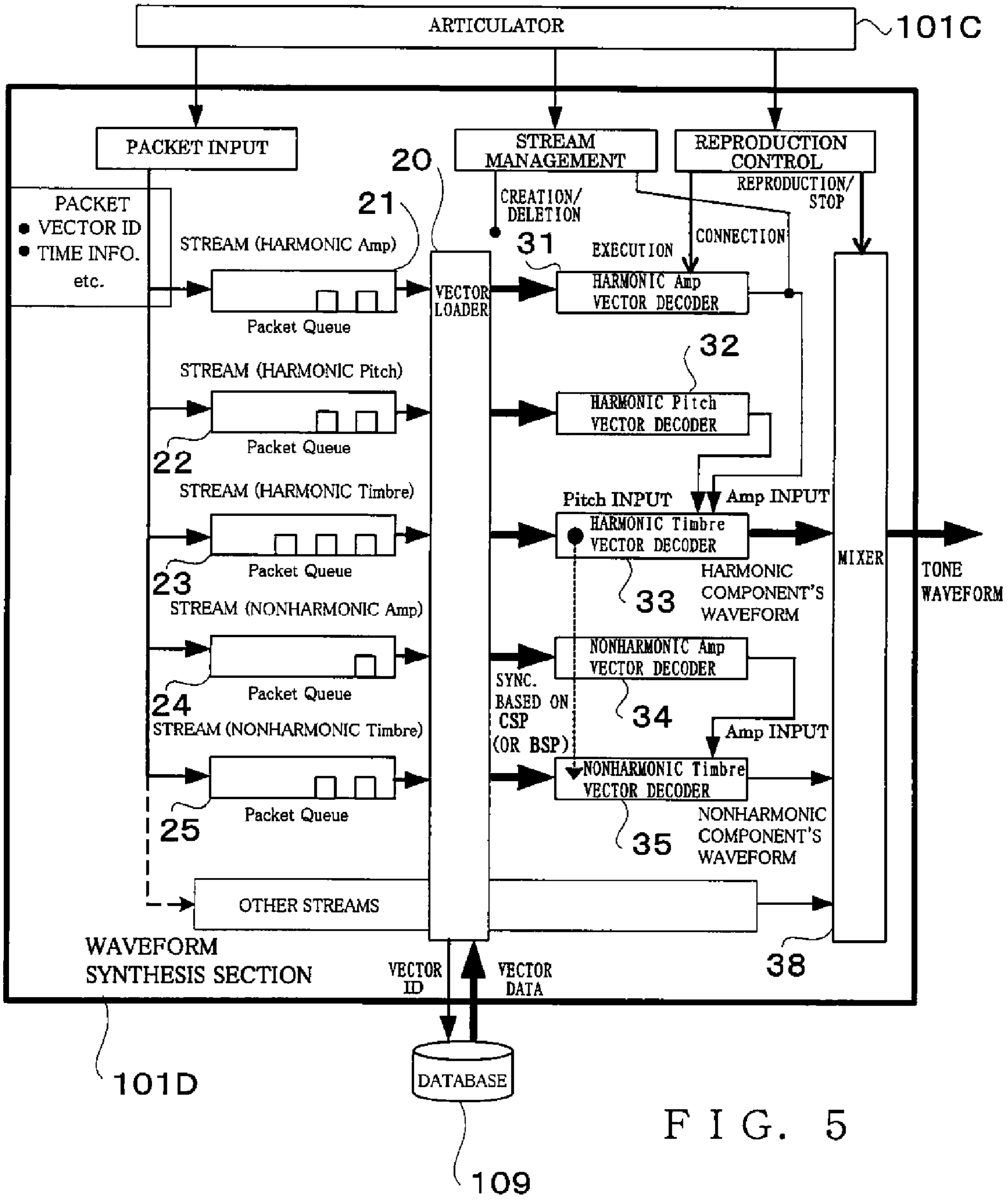
FIG. 5 is a conceptual diagram showing exemplary details of a wave synthesis section shown in FIG. 4.

In the waveform producing apparatus shown in FIG. 1, the waveform production process is performed by the computer executing predetermined waveform producing programs (software). In an alternative, such a waveform production process may be performed by dedicated hardware. Therefore, the following paragraphs describe in greater detail the waveform production process performed by the waveform producing apparatus of the present invention, with reference to FIGS. 4 and 5. FIG. 4 is a block diagram showing an example of the waveform production process performed by dedicated hardware in the waveform producing apparatus, and FIG. 5 is a conceptual diagram showing an exemplary detailed structure of a wave synthesis section 101D shown in FIG. 4.

First, behavior of the waveform producing apparatus will be outlined with reference to FIG. 4. Music piece data reproduction section 101A reproduces music piece data imparted with data indicative of style-of-rendition symbols. Namely, first of all, the music piece data reproduction section 101A receives music piece data imparted with data indicative of style-of-rendition symbols (i.e., performance information). Ordinary musical scores have written thereon various musical signs, such as dynamic signs (e.g., crescendo and decrescendo), tempo signs (e.g., allegro and ritardando), slur sign, tenuto sign and accent signs, which can not be directly converted into MIDI data. Thus, the waveform producing apparatus of the invention converts these musical signs into style-of-rendition data. The music piece data reproduction section 101A receives such style-of-rendition-symbol-imparted music piece data. Musical score interpretation section (player) 101B performs a musical score interpretation operation. Specifically, the musical score interpretation section (player) 101B creates predetermined style-of-rendition designating information on the basis of MIDI data and style-of-rendition symbols contained in the style-of-rendition-symbol-imparted music piece data, and then it outputs the thus-created style-of-rendition designating information to a style-of-rendition synthesis section (articulater) 101C along with corresponding time information. The style-of-rendition synthesis section (articulater) 101C creates packet streams corresponding to the style-of-rendition designating information created by the musical score interpretation section (player) 101B and vector parameters pertaining to the packet streams, and it supplies the thus-created packet streams and vector parameters to the waveform synthesis section 101D. Data sets supplied to the waveform synthesis section 101D as the packet streams each include a vector ID, time information, input note number, etc. Then, the waveform synthesis section 101D retrieves, from the waveform database (hard disk) 109, vector data corresponding to the packet streams, modifies the vector data in accordance with the vector parameters, and synthesizes or combines together waveforms on the basis of the modified vector data to thereby produce a tone waveform. Waveform output section 108 outputs the tone waveform produced by the waveform synthesis section 101D in the above-mentioned manner.

Next, the waveform synthesis operation, performed by the waveform synthesis section 101D shown in FIG. 4, will be described in greater detail, with reference to FIG. 5.

The style-of-rendition synthesis section (articulater) 101C supplies the created packet streams to packet queue buffers 21 to 25 provided in corresponding relation to the factors of the harmonic and nonharmonic components. Namely, the packet streams, created by the style-of-rendition synthesis section (articulater) 101C for the individual factors of the harmonic and nonharmonic components, are sequentially input to the predetermined packet queue buffers 21 to 25 on a packet-by-packet basis. In addition to thus supplying the packet streams to the packet queue buffers 21 to 25, the style-of-rendition synthesis section (articulater) C performs various management and control of the waveform synthesis section 101D, such as packet stream management related to creation/deletion of the individual vector data and connection between the vector data and reproduction control for creation of a desired waveform and reproduction/reproduction termination of the created desired waveform. The packets supplied from the style-of-rendition synthesis section (articulater) 101C are accumulated in the corresponding packet queue buffers 21 to 25, via which they are sequentially sent to a vector loader 20 in predetermined order. Then, the vector loader 20 refers to the respective vector IDs of the packets to thereby read out, from the waveform database 109, original vector data corresponding to the respective vector IDs of the packets.

The vector data read out from the waveform database 109 are delivered to predetermined vector decoders 31 to 35 provided in corresponding relation to the factors of the components, and each of these vector decoders 31 to 35 produces a tone waveform of the corresponding factor.

More specifically, the vector decoders 31 to 35, provided in corresponding relation to the component's factors, each read out various data, such as the vector ID and time information, included in the corresponding packet and thereby produce a desired waveform in a time-serial fashion. For example, the harmonic component's amplitude vector decoder 31 produces an envelope shape of the amplitude factor of the harmonic component, the harmonic component's pitch vector decoder 32 produces an envelope shape of the pitch factor of the harmonic component, and the harmonic component's timbre vector decoder 33 produces a waveform of the timbre factor of the harmonic component. Similarly, the nonharmonic component's amplitude vector decoder 34 produces an envelope shape of the amplitude factor of the nonharmonic component, and the nonharmonic component's timbre vector decoder 35 produces an envelope shape of the timbre factor of the nonharmonic component. The harmonic component's timbre vector decoder 33 produces a harmonic component's waveform having imparted thereto the envelope shape of the harmonic component's amplitude factor and envelope shape of the harmonic component's pitch factor produced by the harmonic component's amplitude vector decoder 31 and harmonic component's pitch vector decoder 32, respectively, and then the timbre vector decoder 33 outputs the thus-produced harmonic component's waveform to a mixer 38. More specifically, the harmonic component's timbre vector decoder 33 receives the envelope shape of the harmonic component's amplitude factor as a vector control instruction (i.e., gain input) for gain control and the envelope shape of the harmonic component's pitch factor as another vector control instruction (i.e., readout speed input) for controlling readout locations of vector data corresponding to the input note number, and then, the harmonic component's timbre vector decoder 33 modifies the harmonic component's waveform vector data, read out from the waveform database 109, in accordance with these vector control instructions. In producing the harmonic component's waveform according to the first embodiment of the synchronizing method, once the readout location of the harmonic component's waveform vector data has coincided with or passed any one of the predetermined positions (e.g., data addresses) set as the cycle synchronizing points CSP, the harmonic component's timbre vector decoder 33 sends a predetermined signal—in this embodiment, cycle sync flag (CSF) signal—, to the nonharmonic component's timbre vector decoder 35.

Because, unlike the harmonic component's waveform, the nonharmonic component's waveform is not synthesized in synchronism with the pitch of the input tone, the nonharmonic component's timbre vector decoder 35 is supplied with no vector control instruction (i.e., speed input) for controlling readout locations of vector data corresponding to the input note (e.g., note number). Therefore, when the nonharmonic component's timbre vector decoder 35 has received the predetermined signal (e.g., cycle sync flag (CSF) signal) transmitted from the harmonic component's timbre vector decoder 33 in response to one of the cycle synchronizing points CSP of the harmonic component's waveform vector data, the timbre vector decoder 35 jumps the readout location of the nonharmonic component's waveform vector data to a predetermined position (e.g., data address) previously set as the cycle synchronizing point CSP in the nonharmonic component's waveform vector data, so that the respective phases of the harmonic and nonharmonic components' waveforms are synchronized with each other. Such phase synchronization will be later described in greater detail. Further, the nonharmonic component's timbre vector decoder 35 produces a nonharmonic component's waveform having imparted thereto the envelope shape of the harmonic component's amplitude factor produced by the nonharmonic component's amplitude vector decoder 34, and then the timbre vector decoder 35 outputs the thus-produced nonharmonic component's waveform to the mixer 38. More specifically, only the envelope shape of the nonharmonic component's amplitude factor is given to the nonharmonic component's timbre vector decoder 35 as the vector control instruction (i.e., gain input) for controlling the gain. In this way, the nonharmonic component's waveform vector data read out from the waveform database 109 are modified appropriately to produce a nonharmonic component's waveform. After that, the thus-produced harmonic and nonharmonic components' waveforms are mixed together via the mixer 38 to thereby produce a tone waveform. Namely, the mixer 38 mixes together the harmonic component's waveform produced by the harmonic component's timbre vector decoder 33 and nonharmonic component's waveform produced by the nonharmonic component's timbre vector decoder 35, so as to produce an ultimate tone waveform.

As having been set forth above, when the readout location of the harmonic component's waveform vector data has coincided with any one of the predetermined positions (e.g., data addresses) set as the cycle synchronizing points CSP during the production process of the harmonic component's waveform through the pitch control based on the readout location control of the vector data, the harmonic component's timbre vector decoder 33 sends the predetermined signal (e.g., cycle sync flag (CSF) signal) to the corresponding nonharmonic component's timbre vector decoder 35, so that the nonharmonic component's timbre vector decoder 35 can then read out the nonharmonic component's waveform vector data while periodically synchronizing the phases of the harmonic component's waveform produced by the harmonic component's timbre vector decoder 33 and nonharmonic component's waveform produced by the nonharmonic component's timbre vector decoder 35.

Figure 6A:
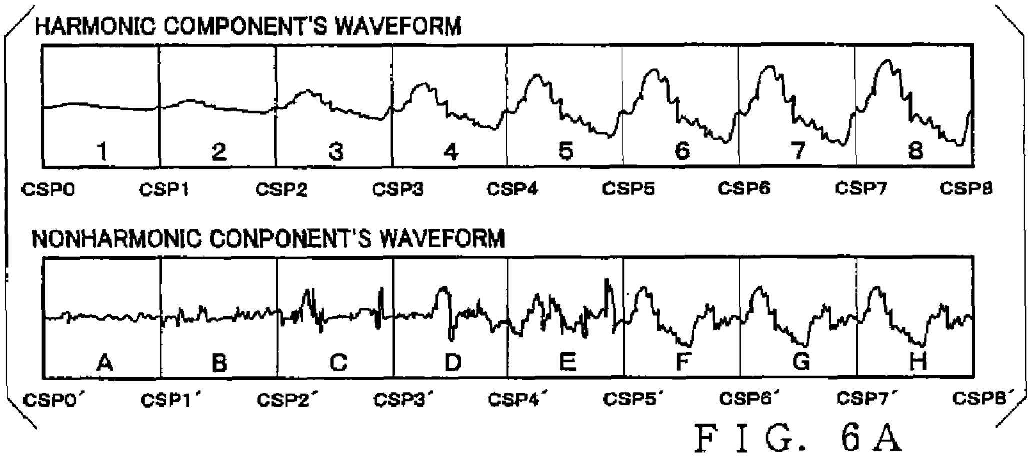
FIGS. 6A to 6C are conceptual diagrams explanatory of periodic, synchronized readout, in the embodiment, of harmonic and nonharmonic components' waveforms based on cycle synchronizing points.
Figure 6B:
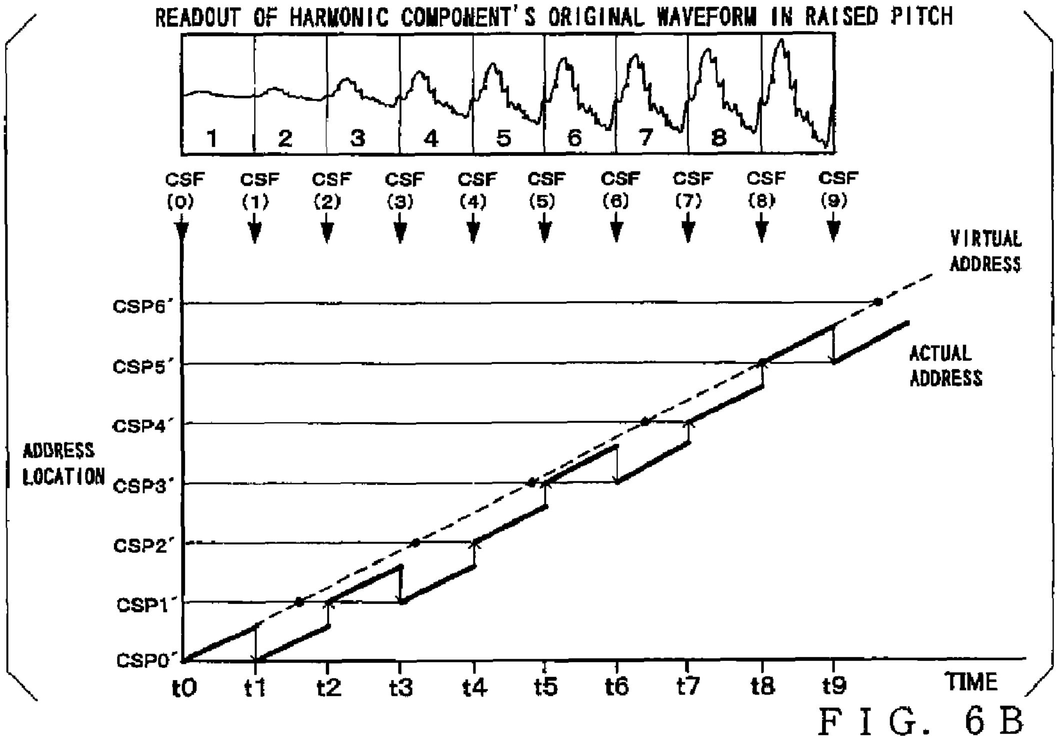
Figure 6C:
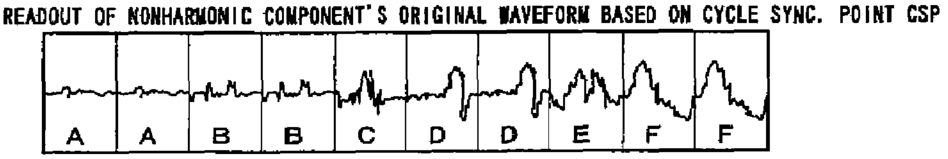

Next, with reference to FIGS. 6A to 6C, a detailed description will be made about the periodic, synchronized readout of the harmonic and nonharmonic components' waveforms using the cycle synchronizing points CSP contained in the harmonic component's waveform vector data and corresponding nonharmonic component's waveform vector data. FIGS. 6A to 6C are conceptual diagrams explanatory of the periodic, synchronized readout of the harmonic and nonharmonic components' waveforms based on the cycle synchronizing points CSP. More specifically, FIG. 6A is a waveform diagram schematically showing harmonic component's waveform vector data read out from the waveform database (hereinafter referred to as a "harmonic component's original waveform") and corresponding nonharmonic component's waveform vector data read out from the waveform database (hereinafter referred to as a "nonharmonic component's original waveform"). FIG. 6B is a conceptual diagram explanatory of progression in addresses to be used for reading out the nonharmonic component's original waveform in a case where the harmonic component's original waveform has been read out in accordance with a predetermined pitch (raised pitch in this case). Further, FIG. 6C is a waveform diagram schematically showing the nonharmonic component's waveform having been read out in accordance with the address progression of FIG. 6B (i.e., results of the periodic, synchronized readout of the nonharmonic component's waveform using the cycle synchronizing points CSP. Note however that the description will be made about the periodic, synchronized readout of only given portions of the harmonic and nonharmonic components' waveforms. Further, to facilitate understanding of the description, there are shown here a cycle synchronizing point CSP0 corresponding to a not-shown section (waveform section 0) of the harmonic waveform, and a cycle synchronizing point CSP0' set in the nonharmonic component's waveform in corresponding relation to the cycle synchronizing point CSP0 of the harmonic waveform.

As shown in FIG. 6A, the harmonic component's original waveform contains the cycle synchronizing point CSP at a predetermined position for every predetermined number of wave cycle units (e.g., for each wave cycle unit). In the illustrated example, the harmonic component's original waveform contains eight cycle synchronizing points CSP1 to CSP8 corresponding to eight waveform sections 1 to 8 divided from each other every predetermined wave cycle unit. The nonharmonic component's original waveform, corresponding to the harmonic component's original waveform, contains eight cycle synchronizing points CSP1' to CSP8' that correspond in position to the eight cycle synchronizing points CSP1 to CSP8 corresponding to eight waveform sections 1 to 8 of the harmonic component's original waveform. Therefore, waveform sections 1 to 8 obtained by dividing the harmonic component's original waveform at the eight cycle synchronizing points CSP1 to CSP8 and waveform sections A to H obtained by dividing the nonharmonic component's original waveform at the eight cycle synchronizing points CSP1' to CSP8' are divided at same wave cycle units. Thus, at such cycle synchronizing points, the harmonic component's original waveform and the nonharmonic component's original waveform are synchronized in phase with each other.

The waveform diagram shown in the top row of FIG. 6B represents the harmonic component's original waveform of FIG. 6A read out by the harmonic component's timbre vector decoder 33 in accordance with a predetermined pitch. In FIG. 6B, the thus read-out harmonic component's original waveform is denoted as time-axially contracted as compared to the one of FIG. 6A, which means that the harmonic component's original waveform of FIG. 6A has been read out in a raised pitch. Once the harmonic component's timbre vector decoder 33, which is reading out the harmonic component's original waveform in accordance with a predetermined pitch, has read out any one of the predetermined positions set as the cycle synchronizing points CSP in the harmonic component's original waveform, the timbre vector decoder 33 sends the above-mentioned CSF signal to the corresponding nonharmonic component's timbre vector decoder 35 (see FIG. 4 above). In the illustrated example, the harmonic component's timbre vector decoder 33 sends a series of the CSF signals to the nonharmonic component's timbre vector decoder 35 in the following manner: at time point t1, CSF signal CSF(1) corresponding to the cycle synchronizing point CSP1; at time point t2, CSF signal CSF(2) corresponding to the cycle synchronizing point CSP2; at time point t3, CSF signal CSF(3) corresponding to the cycle synchronizing point CSP3; at time point t4, CSF signal CSF(4) corresponding to the cycle synchronizing point CSP4; at time point t5, CSF signal CSF(5) corresponding to the cycle synchronizing point CSP5; at time point t6, CSF signal CSF(6) corresponding to the cycle synchronizing point CSP6; at time point t7, CSF signal CSF(7) corresponding to the cycle synchronizing point CSP7; at time point t8, CSF signal CSF(8) corresponding to the cycle synchronizing point CSP8; and at time point t9, CSF signal CSF(9) corresponding to the cycle synchronizing point CSP9 (not shown in FIG. 6A).

In a lower portion of FIG. 6B, there is shown a variation over time in waveform readout locations (i.e. address progression) to be used by the nonharmonic component's timbre vector decoder 35 to read out the nonharmonic component's waveform. In the illustrated example, an actual address progression is denoted by solid lines, and a virtual address progression is denoted by broken lines. The actual address progression represents a variation over time in actual readout locations (readout address locations) to be used by the nonharmonic component's timbre vector decoder 35 to read out the nonharmonic component's waveform, while the virtual address progression represents a variation over time in virtual readout locations (virtual readout address locations). As noted earlier, once the nonharmonic component's timbre vector decoder 35 receives the CSF signal from the harmonic component's timbre vector decoder 33, the nonharmonic component's timbre vector decoder 35 shifts the current actual readout location of the nonharmonic component's original waveform to the cycle synchronizing point CSP immediately before the corresponding virtual readout location. Note that the terms "virtual readout location" is used herein to refer to a readout location that would be used if the waveform readout operation is continued virtually without being influenced by the readout of the cycle synchronizing point CSP. Let it be assumed here that the speed of the virtual address progression in the illustrated example is identical to the readout speed (i.e., actual address progression speed) of the nonharmonic component's original waveform. Namely, in the illustrated example of FIG. 6B, the broken lines representing the virtual address progression have a same inclination angle as the solid lines representing the actual address progression.

In the illustrated example of FIG. 6B, the readout of the nonharmonic component's original waveform is initiated at time point t0. At next time point t1, the CSF signal CSF(1) is received in accordance with the cycle synchronizing point CSP1 set in the harmonic component's waveform. Because the address location immediately before the virtual address location, based on the virtual address progression, at this time point t1 is "CSP0'", the actual address is jumped back to the address location CSP0', so that the readout of the nonharmonic component's waveform is re-started at the address location CSP0'. Namely, in this case, after the readout has advanced to an enroute point of waveform section A of the nonharmonic component's waveform in a time period from time point t0 to time point t1 as shown in FIG. 6C, waveform section A is again read out from the beginning at time point t1. Upon arrival at next time point t2, the CSF signal CSF(2) is received in accordance with the cycle synchronizing point CSP2 set in the harmonic component's waveform. Because the address location immediately before the virtual address location, based on the virtual address progression, at this time point t2 is "CSP1'", the actual address is jumped back to the address location CSP1', so that the readout of the nonharmonic component's waveform is carried out from the address location CSP1' onward. Namely, at step t2, the readout of waveform section A initiated at time point t1 is halted on the way, and then the readout of waveform section B is initiated. Then, at step t3, the CSF signal CSF(3) is received in accordance with the cycle synchronizing point CSP3 set in the harmonic component's waveform. Because the address location immediately before the virtual address location, based on the virtual address progression, at this time point t3 is "CSP1'", the actual address is jumped back to the address location CSP1', so that the readout of waveform section B is re-started at the address location CSP1'. At next step t4, the CSF signal CSF(4) is received in accordance with the cycle synchronizing point CSP4 set in the harmonic component's waveform. Because the address location immediately before the virtual address location, based on the virtual address progression, at this time point t4 is "CSP2'", the actual address is jumped back to the address location CSP2', so that the readout of waveform section C is initiated at the address location CSP2'. Namely, in the periods from time point t2 to time point t3 and from time point t3 to time point t4, waveform section B is repetitively read out from the beginning to an enroute point thereof. Similarly, at and after time point t5, the CSF signals are received sequentially in accordance with the subsequent cycle synchronizing points CSP5 to CSP8 (CSP9) so that the readout of the nonharmonic component's waveform is continued with the actual address location varied at each individual time point when the CSF signal is received from the harmonic component's timbre vector decoder 33.

Thus, the nonharmonic component's timbre vector decoder 35 can read out the nonharmonic component's waveform in accordance with the actual address progression of FIG. 6B so that the read-out waveform assumes a shape as illustratively shown in FIG. 6C. The harmonic component's waveform shown in FIG. 6B and the nonharmonic component's waveform shown in FIG. 6C are read out in such a manner that the two waveforms are synchronized with each other every predetermined cycle, i.e. at each predetermined position where the cycle synchronizing point CSP is set. At each predetermined periodic position set as the cycle synchronizing point CSP, the instant embodiment allows the harmonic component's waveform and nonharmonic component's waveform to be synchronized in phase with each other. Therefore, when the harmonic component's waveform and nonharmonic component's waveform are being synthesized or combined together, these two waveforms can be made to have no phase difference at each of the predetermined periodic positions. In this manner, the instant embodiment of the waveform producing apparatus can synthesize together the harmonic and nonharmonic components' waveforms while periodically synchronizing the respective phases. Particularly, in a case where spike-shaped waveform parts appear periodically on the nonharmonic component's waveform in synchronism with cycles of the corresponding harmonic component's waveform, and if predetermined periodic positions where peak values of such spike-shaped waveform parts appear are set as the cycle synchronizing points CSP, there will be produced no phase difference between the harmonic and nonharmonic components' waveforms at the peaks of the spike-shaped waveform parts. Because phase differences in the spike-shaped waveform parts, particularly at their peaks or the like, can often become one of the greatest causes to invite deterioration in tone quality, noise, etc., the waveform producing apparatus of the invention arranged in the above-described manner can produce a high-quality waveform free of tone quality deterioration, noise, etc., by eliminating the phase differences at the peaks or the like in the spike-shaped waveform parts.

It should be noted that the speed of the virtual address progression used in the readout of the nonharmonic component's waveform shown in FIG. 6B may be raised or lowered, in stead of the progression speed corresponding to the pitch of the nonharmonic component's original waveform being used just as it is. In such a case, the speed of the virtual address progression used in the readout of the nonharmonic component's waveform may be raised or lowered in correspondence with the pitch of the harmonic component's waveform. Further, the periodic phase synchronization of the harmonic and nonharmonic components' waveforms may be performed using a simplified algorithm such that, upon generation of the CSF signal, the readout address is jumped to a nearest cycle synchronizing point, instead of using the above-mentioned virtual addresses.

It should also be appreciated that the above-described inventive control for periodically synchronizing the readout locations of the harmonic and nonharmonic components' waveforms in accordance with the cycle synchronizing points CSP may be applied to other cases than the above-described case where the readout speeds of the individual vector data vary in response to a tone pitch. For example, the above-described readout location synchronization control may be applied to a case where time-axial stretch/contraction of an entire waveform to be produced is controlled by performing TSC control on an attack portion and joint portion, or an attack portion and release portion, rather than in response to a tone pitch. Alternatively, the inventive readout location synchronization control may be applied to a case where time-axial stretch/contraction of an entire waveform to be produced is controlled by controlling a cross-fade synthesizing time between loop waveform segments connecting an attack portion and joint portion, or an attack portion and release portion, or by adding or deleting the loop waveform segments to be used for connecting an attack portion and joint portion, or an attack portion and release portion.

It should also be obvious that the above-described embodiment may be arranged to allow the user to set or modify, for each predetermined cycle, the cycle synchronizing points CSP of the harmonic component's waveform vector data and corresponding nonharmonic component's waveform vector data at or to appropriate positions.

Next, a description will be made about a second embodiment of the synthesizing method employed in the present invention. In this second embodiment too, the same arrangements as shown and described in relation to FIGS. 1, 2, 4 and 5 can be applied, and hence description of these arrangements is omitted here to avoid unnecessary duplication.

In the second embodiment, synchronizing position information created by the "vector creation operation" at step S4 of the waveform database creation process of FIG. 2 is different in type from that created in the above-described first embodiment. Namely, in the second embodiment, to create harmonic component's waveform vector data and corresponding nonharmonic component's waveform vector data for a nonsteady state portion, such as an attack, release or joint portion, at step S4, desired time positions of the harmonic and nonharmonic components' waveform vector data are set as block synchronizing point or positions BSP. Such a block synchronizing position BSP is synchronizing position information to be used for performing waveform synthesis between the harmonic component's waveform vector data and the corresponding nonharmonic components' waveform vector data while synchronizing respective characteristic waveform block segments of the harmonic and nonharmonic components' waveforms; specifically, predetermined data addresses are stored as the block synchronizing positions BSP.

Figure 7A:
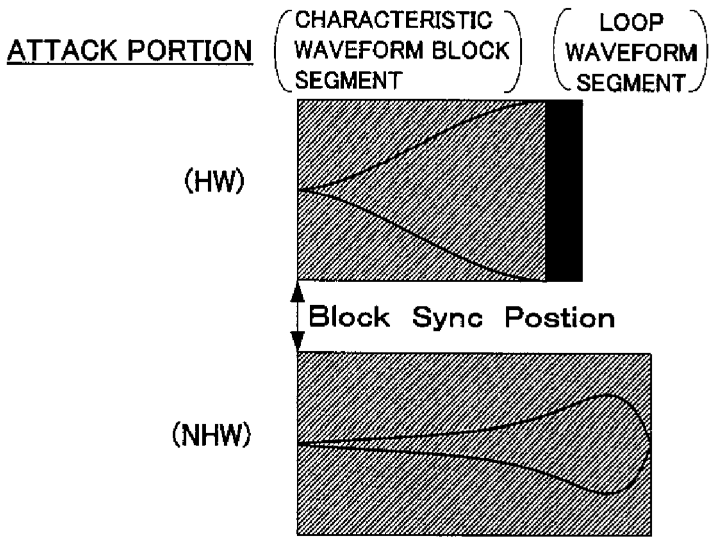
FIGS. 7A to 7C are conceptual diagrams showing examples of harmonic component's waveform vector data and nonharmonic component's waveform vector data created in a second embodiment of the present invention.
Figure 7B:
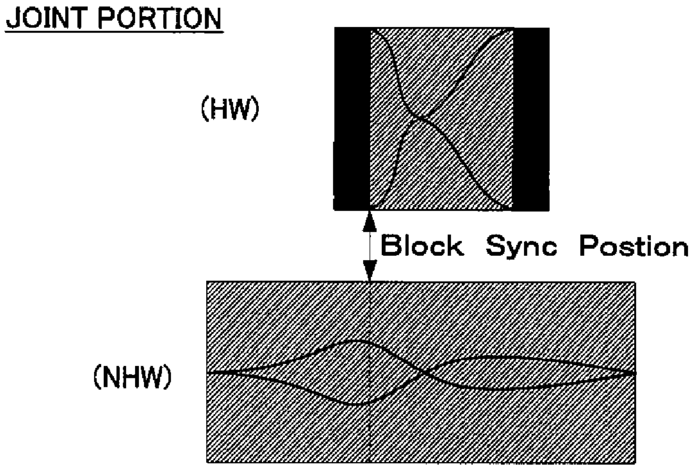
Figure 7C:
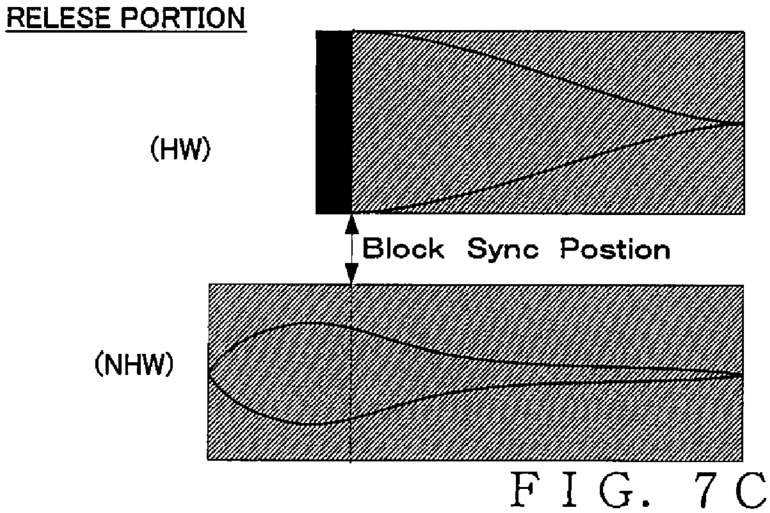

FIGS. 7A to 7C are conceptual diagrams showing examples of harmonic component's waveform vector data and nonharmonic component's waveform vector data created on the basis of the second embodiment of the synchronizing method. More specifically, FIGS. 7A to 7C show examples of harmonic and nonharmonic components' waveform vector data of an attack, body, joint and release portions, using their respective envelope shapes. In each of FIGS. 7A to 7C, the example of the harmonic component's waveform vector data (HW) is shown on an upper row while the example of the nonharmonic component's waveform vector data (NHW) is shown on a lower row.

As shown in FIG. 7A, the harmonic component's waveform vector data (HW) of the attack portion comprises a combination of a characteristic waveform block segment where data indicative of a characteristic waveform shape are stored in succession (hatched part in the figure) and a loop waveform segment that follows the characteristic waveform block segment and that can be read out repeatedly (filled-in-black part in the figure). The characteristic waveform block segment is a high-quality waveform segment (nonloop waveform segment) having characteristics of a style of rendition (or articulation) etc. The loop waveform segment is a unit waveform segment of a relatively monotonous tone portion, which consists of one or an appropriate plurality of wave cycles. As shown in FIG. 7B, the harmonic component's waveform vector data (HW) of the joint portion comprise a combination of data of a loop waveform segment, a characteristic waveform block segment and a loop waveform segment. Further, as shown in FIG. 7C, the harmonic component's waveform vector data (HW) of the release portion comprise a combination of data of loop waveform segments and a characteristic waveform block segment. Nonharmonic component's waveform vector data (NHM) corresponding to the harmonic component's waveform vector data only comprise data of a characteristic waveform block segment. In the harmonic component's waveform vector data having the characteristic waveform block segment, i.e., in the harmonic component's waveform vector data comprising data of the nonsteady state portion, a desired position in the characteristic waveform block segment is stored as the block synchronizing position BSP. As seen from FIGS. 7A to 7C, the block synchronizing position BSP is generally set in the harmonic component's waveform vector data at the beginning of each region where the respective characteristic waveform block segments of the harmonic and nonharmonic components' waveform vector data overlap with each other. Block synchronizing positions BSP are also set in the characteristic waveform block segments of the nonharmonic component's waveform vector data in corresponding relation to the block synchronizing positions BSP set in the characteristic waveform block segments of the harmonic component's waveform vector data set. That is, in the nonharmonic component's waveform vector data to be created along with the harmonic component's waveform vector data, positions corresponding to the block synchronizing positions BSP of the harmonic component's waveform vector data are set as the block synchronizing positions BSP. Specifically, because the harmonic and nonharmonic component's waveform vector data are generally read out in accordance with predetermined readout addresses, such predetermined data addresses are stored as the block synchronizing positions BSP.

Whereas the embodiment has been set forth as setting the block synchronizing position BSP at the beginning of each of the overlapping regions between the characteristic waveform block segments of the harmonic and nonharmonic component's waveform vector data, the block synchronizing position BSP may be set at any other desired position in the overlapping region. Further, although it suffices to set one block synchronizing position BSP in each of the characteristic waveform block segments of the harmonic and nonharmonic component's waveform vector data, a plurality such block synchronizing positions BSP may be set at any desired positions in each of the characteristic waveform block segments of the harmonic and nonharmonic component's waveform vector data.

The following paragraphs describe only a portion of the waveform synthesis process, performed by the waveform synthesis section 101D of FIG. 4, which is characteristic of the second embodiment, i.e. which is different from the waveform synthesis process performed in accordance with the above-described first embodiment of the synchronizing method.

Although the outline of the waveform synthesis process performed in accordance with the second embodiment of the synchronizing method is similar to that illustrated in FIG. 5 in relation to the first embodiment, the synchronizing position information given from the vector loader 20 to the individual vector decoders 31 to 35 in the second embodiment is different in type from the synchronizing position information employed in the first embodiment. Namely, the synchronizing position information given from the vector loader 20 to the individual vector decoders 31 to 35 in the second embodiment is information indicative of the above-mentioned block synchronizing points or positions BSP, rather than the cycle synchronizing points CSP employed in the first embodiment. Thus, an outline of control based on the block synchronizing position information will be given below, with reference to FIG. 5, by replacing the "cycle synchronizing point" CSP shown in FIG. 5 with the block synchronizing position BSP. In producing a harmonic component's waveform in accordance with the vector data readout location control, when the readout location of the harmonic component's waveform vector data has coincided with any one of the predetermined positions (e.g., data addresses) stored as the block synchronizing positions BSP, the harmonic component's timbre vector decoder 33 sends a predetermined signal—in this embodiment, block sync flag (BSF) signal—, to the corresponding nonharmonic component's timbre vector decoder 35.

Because, unlike the harmonic component's waveform, the nonharmonic component's waveform is not synthesized in synchronism with a pitch of an input tone as previously noted, the nonharmonic component's timbre vector decoder 35 is supplied with no vector control instruction (i.e., readout speed input) for controlling the readout locations of the vector data in accordance with an input note '(e.g., note number). Therefore, when the nonharmonic component's timbre vector decoder 35 has received the predetermined signal (e.g., block sync flag (BSF) signal) transmitted from the harmonic component's timbre vector decoder 33 in response to the readout of the block synchronizing position BSP set in each of the characteristic waveform block segments of the harmonic component's waveform vector data set, the timbre vector decoder 35 jumps the readout location of the nonharmonic component's waveform vector data to a predetermined position (e.g., data address) preset as the block synchronizing position BSP in the nonharmonic component's waveform vector data, so that the nonharmonic component's waveform can be synchronized with a corresponding part of the harmonic component's waveform. The remaining portions of the process performed in the second embodiment by the waveform synthesis section of FIG. 5 are generally the same as described earlier in relation to the first embodiment, and hence will not be described here to avoid unnecessary duplication.

As having been set forth above, when the readout location of the harmonic component's waveform vector data has coincided with any one of the predetermined positions (e.g., data addresses) stored as the block synchronizing positions BSP during production of the harmonic component's waveform through the pitch control based on the readout location control of the vector data, the harmonic component's timbre vector decoder 33 sends the predetermined signal (e.g., block sync flag (BSF) signal) to the nonharmonic component's timbre vector decoder 35, so that the harmonic component's waveform produced by the harmonic component's timbre vector decoder 33 and the nonharmonic component's waveform produced by the nonharmonic component's timbre vector decoder 35 can be synchronized with each other at every predetermined position.

Figure 8A:
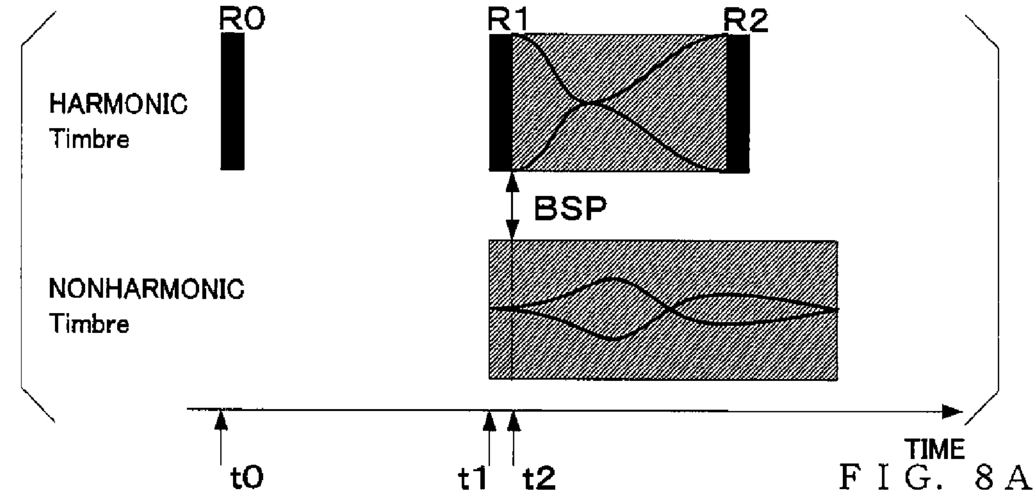
Figure 8B:
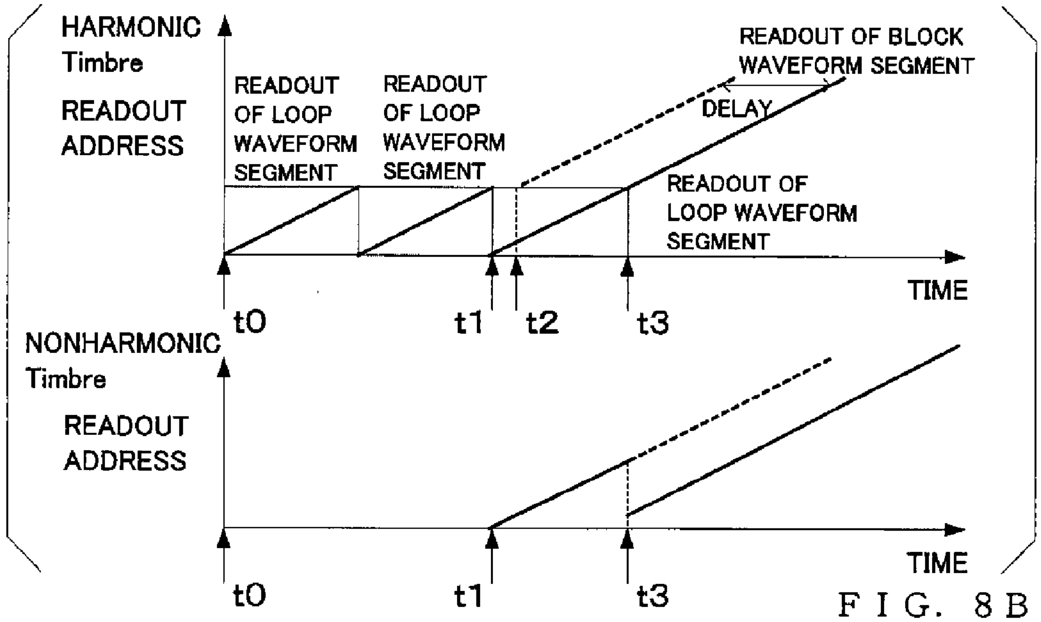
Figure 8C:
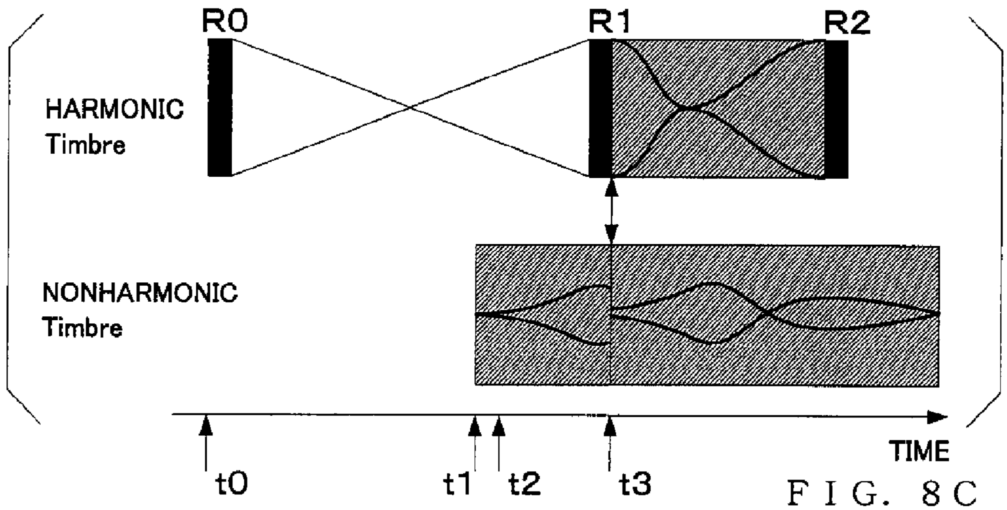

Next, with reference to FIGS. 8A to 8C, a description will be made about synchronized readout of the harmonic and nonharmonic components' waveform vector data using the block synchronizing positions BSP preset at desired positions of the characteristic waveform block segments. Specifically, FIGS. 8A to 8C are conceptual diagrams explanatory of the synchronized readout of the harmonic and nonharmonic components' waveform vector data in relation to a case where a waveform of a body portion (only a trailing-end loop waveform segment R0 of the body portion is shown in the figures) is connected with a waveform of a succeeding characteristic waveform block segment. More specifically, FIG. 8A is a diagram schematically showing the body portion and characteristic waveform block segment read out from the waveform database and arranged on a predetermined time axis in accordance with time information; specifically, the harmonic component's waveform (vector data) is shown in an upper row of the figure, while the nonharmonic component's waveform (vector data) is shown in a lower row of the figure. FIG. 8B is a conceptual diagram explanatory of a variation over time of waveform readout locations (i.e., address progression) when the harmonic component's waveform and nonharmonic component's waveform shown in FIG. 8A are read out in accordance with a predetermined pitch; specifically, the address progression to be used by the harmonic component's timbre vector decoder 33 (FIG. 5) to read out the harmonic component's waveform is shown in an upper row of the figure, while the address progression to be used by the nonharmonic component's timbre vector decoder 35 (FIG. 5) to read out the nonharmonic component's waveform is shown in a lower row of the figure. Inclination angle of the address progression shown in the figure corresponds to the readout pitch. Further, FIG. 8C is a diagram schematically showing the harmonic and nonharmonic components' waveforms read out in accordance with the respective address progression of FIG. 8B and arranged on a predetermined time axis; that is, FIG. 8C schematically shows results of the synchronized readout of the harmonic and nonharmonic components' waveform vector data based on the block synchronizing positions BSP.

In FIGS. 8A to 8C, "t0" to "t3" represent predetermined time points, which are denoted, for convenience of explanation, to indicate readout start timing of the characteristic waveform block segments (hatched portions in the figures), loop waveform segments (filled-in-black portions in the figures), etc. Double-head arrows denoted between the characteristic waveform block segments of the harmonic component's waveform and the nonharmonic component's waveform show, for convenience of illustration, the positions set as the corresponding block synchronizing positions BSP in the characteristic waveform block segments of both of the harmonic and nonharmonic components' waveforms. Namely, in this embodiment, the beginning or head position of the characteristic waveform block segment in the harmonic component's waveform and the predetermined position, other than the head position, of the characteristic waveform block segment in the nonharmonic component's waveform are set as the block synchronizing positions BSP.

As seen from FIG. 8A, the loop waveform segment and characteristic waveform block segment are arranged on the predetermined time axis in accordance with respective predetermined time information that is, for example, calculated on the basis of note-on and note-off events etc. and included in the packets supplied from the style-of-rendition synthesis section (articulater) 101C of FIG. 5. In the harmonic component's waveform illustrated in FIG. 8A, the leading-end loop waveform segment R0 of the body portion is placed in the position of time point t1, and the characteristic waveform block segment with loop waveform segments R1 and R2 is placed in the position of time point t1. In the nonharmonic component's waveform, on the other hand, the characteristic waveform block segment is placed in a position corresponding to the placed position of the characteristic waveform block segment of the harmonic component's waveform; the characteristic waveform block segment of the nonharmonic component's waveform is placed in the position of time point t1 where the characteristic waveform block segment, having the loop waveform segments R1 and R2, of the harmonic component's waveform is placed.

In the harmonic component's waveform, as stated previously, the waveforms of the preceding body portion and succeeding characteristic waveform block segment are interconnected by cross-fade synthesis between their respective loop waveform segments. During the interconnection between the waveforms of the preceding body section and succeeding characteristic waveform block segment, the instant embodiment performs control or phase adjustment to bring the respective loop waveform segments of the preceding body section and succeeding characteristic waveform block segment into phase with each other. For the cross-fade readout, the loop waveform segment R0 is read out repeatedly for a predetermined time period preceding time point t0. As seen from FIG. 8B, because this embodiment is arranged to initiate the cross-fade readout of the loop waveform segment R0 and loop waveform segment R1 at time point t0, the readout of the loop waveform segment R1 is initiated at time point t0. At that time point t0, the readout of the loop waveform segment R1 must be carried out in the same phase as the preceding loop waveform segment R0. In the illustrated example of FIG. 8B, the loop waveform segment R0 takes on a phase "0" at time point t0, in response to which the succeeding loop waveform segment R1 also starts to be read out with the same phase "0" at time point t0; similarly, if the loop waveform segment R0 takes on a phase "α" at time point t0, then the succeeding loop waveform segment R1 also starts to be read out with the same phase "α". By performing such phase adjustment at time point t0, the preceding loop waveform segment R0 and succeeding loop waveform segment R1 are read out repeatedly from time point t0 onward; note that in FIG. 8B, there are shown only readout addresses of the loop waveform segment R1. Such phase adjustment can prevent the waveforms of the two loop waveform segments R0 and R1 from undesirably canceling each other due to the cross-fade synthesis.

In addition to being subjected to the phase adjustment, the loop waveform segments and waveform block segment are placed on the predetermined time axis in accordance with the respective predetermined time information as noted earlier, and thus, if the readout of the waveform block segment is initiated at time point t2 where the waveform block segment is placed, waveform continuity will be lost between the loop waveform segment R1 and the waveform block segment, so that continuity of the tone in question will also be broken undesirably. To avoid such an inconvenience, the instant embodiment waits the readout timing of the waveform block segment until one wave cycle of the loop waveform segment R1 has been completely read out in the third readout operation initiated at time point t1 so that the respective waveforms of the loop waveform segment R1 and waveform block segment can be interconnected continuously with no break; specifically, in the illustrated example, the readout of the waveform block segment is waited till time point t3. As a consequence, the readout timing of the waveform block segment is delayed from time point t2 to time point t3, so that the readout of the waveform block segment is initiated at time point t3 rather than at time point t2. Thus, at and after time point t3, the waveform block segment will be read out delayed as compared to the case where the readout timing of the waveform block segment is not waited at all; namely, the readout of the characteristic waveform block segment is shifted from a position denoted by a broken line in the figure to a position denoted by a solid line. By so doing, the instant embodiment can eliminate the possibility of the waveform continuity being lost between the loop waveform segment R1 and the waveform block segment. With such address progression, the harmonic component's waveform can be read out in the manner as shown in the upper row of FIG. 8C; that is, the preceding loop waveform segment R0 and succeeding loop waveform segment R1 are read out repeatedly for a tome period from time point t0 to t3 while being subjected to cross-fade synthesis, and then the waveform block segment is read out from time point t3 onward.

For the nonharmonic component's waveform, on the other hand, the readout of the waveform block segment is initiated at time point t1 in accordance with the time information irrespective of the delay in the readout timing of the harmonic component's waveform, as seen from FIG. 8B. Then, upon arrival at time point t3, when the readout location of the waveform block segment of the harmonic component's waveform coincides with the block sync position BSP set in the waveform block segment, the nonharmonic component's timbre vector decoder 35 receives the predetermined signal (e.g., block sync flag signal) from the harmonic component's timbre vector decoder 33. Then, the address location at time point t3 is jumped to another address location set as the block sync position BSP, so that the same waveform block segment of the nonharmonic component's waveform is read out again from the address location set as the block sync position BSP. Namely, after the waveform block segment of the nonharmonic component's waveform has been read out to an enroute point thereof during a period from time point t1 to time point t3, the same waveform block segment is read out again at and after the address location set as the block sync position BSP. With such address progression, the nonharmonic component's waveform can be read out in the manner as shown in the lower row of FIG. 8C; that is, the readout of the nonharmonic component's waveform is initiated at time point t1, and then, upon arrival at time point t3, the already read-out range of the nonharmonic component's waveform is again read out from its beginning onward.

Thus, the harmonic component's timbre vector decoder 33 and nonharmonic component's timbre vector decoder 35 can read out the harmonic and nonharmonic components' waveforms in accordance with the address progression of FIG. 8B so that the read-out waveforms assume respective shapes as illustratively shown in FIG. 8C. Namely, even when the readout of the waveform block segment of the harmonic component's waveform has been delayed due to the phase adjustment during synthesis between the harmonic and nonharmonic components' waveforms, the instant embodiment synchronizes the respective readout timing of the waveform block segments of the two waveforms at each of the predetermined positions set as the block synchronizing positions BSP and repeatedly reads out the characteristic waveform block segment of the nonharmonic component's waveform over a predetermined range of the characteristic waveform block segment, with the result that it can always reliably eliminate any phase difference between the characteristic waveform block segments of the two waveforms.

Namely, the second embodiment of the synchronizing method performed in the waveform producing apparatus too can synchronize the respective readout timing of the waveform block segments of the harmonic and nonharmonic components' waveforms at each of the predetermined positions set as the block synchronizing positions BSP and thereby synthesize together the harmonic and nonharmonic components' waveforms with the phases of the respective characteristic blocks duly synchronized with each other. As a result, the waveform producing apparatus of the invention can produce a high-quality waveform.

It should be appreciated that when the nonharmonic component's waveform is to be again read out from the address location set as the block synchronizing position BSP, the nonharmonic component's waveform may be read out while being subjected to the cross-fade synthesis within a predetermined time range. Thus, even when the readout location of the waveform block segment of the harmonic component's waveform has been changed on the basis of the block synchronizing position BSP, the waveform producing apparatus advantageously achieves smooth waveform connection of the nonharmonic component's waveform with no intervening break.

In a case where a waveform block segment or the like of a nonharmonic component's waveform, having spike-shaped waveform parts caused in synchronism with a corresponding harmonic component's waveform, is used after having been a pitch shift operation, setting a predetermined position, where peak values or the like of such spike-shaped waveform parts appear, as the block synchronizing position BSP, there will be produced no phase difference between the harmonic and nonharmonic components' waveforms at the peaks or the like of the spike-shaped waveform parts. Because phase differences in the spike-shaped waveform parts, particularly at their peaks or the like, can become one of the greatest causes to invite deterioration in tone quality, noise, etc., the waveform producing apparatus can produce a high-quality waveform free of tone quality deterioration, noise, etc., by eliminating the phase differences at the peaks or the like in the spike-shaped waveform parts. By thus setting the block synchronizing position BSP at the predetermined position in the waveform block segment, it is possible to effectively prevent a synchronization error that would occur between the waveform block segments of the harmonic and nonharmonic components' waveforms during the pitch shift operation.

It should also be appreciated that the above-described synchronization control between the waveform block segments of the harmonic and nonharmonic components' waveforms based on the block synchronizing position BSP may of course be applied to a case where the readout speed of the individual vector data varies in response to a tone pitch. Further, the above-described synchronization control of the invention may be applied to a case where time-axial stretch/contraction of an entire waveform to be produced is controlled by performing TSC control of the waveform block segments of the harmonic and nonharmonic components' waveforms.

Furthermore, whereas the second embodiment has been described as arranged to preset the block synchronizing positions BSP in the waveform block segments of the harmonic component's waveform and corresponding nonharmonic component's waveform, the embodiment may be arranged to allow the user to set or modify the block synchronizing positions BSP at or to appropriate positions for each of the waveform block segments.

It should also be obvious that in the case where a plurality of the block synchronizing positions BSP are preset in each of the waveform block segments of the harmonic and nonharmonic components' waveform vector data, the synchronization control is performed in such a manner that the block synchronizing positions BSP in the corresponding waveform block segments of the harmonic and nonharmonic components' waveform vector data correspond to each other.

Note that in the case where the above-described waveform producing apparatus is applied to an electronic musical instrument, the electronic musical instrument may be of any type other than the keyboard-type instrument, such as a stringed, wind or percussion instrument. In such a case, the present invention is of course applicable not only to such an electronic musical instrument where all of the music piece data reproduction section 101A, musical score interpretation section 101B, style-of-rendition synthesis section 101C, waveform synthesis section 101D and the like are incorporated together as a unit within the musical instrument, but also to another type of electronic musical instrument where the above-mentioned sections are provided separately and interconnected via communication facilities such as a MIDI interface, various networks and the like. Further, the waveform producing apparatus of the present invention may comprise a combination of a personal computer and application software, in which case various processing programs may be supplied to the waveform producing apparatus from a storage media such as a magnetic disk, optical disk or semiconductor memory or via a communication network. Furthermore, the waveform producing apparatus of the present invention may be applied to automatic performance apparatus such as a player piano.

In summary, the present invention having been described so far is characterized by reading out data of harmonic and nonharmonic components' waveforms while synchronizing their respective readout locations per predetermined position corresponding to a predetermined cycle. With this arrangement, the present invention can synthesize or combine together the waveforms while effectively eliminating a phase difference between the two waveforms at each of the readout locations. As a result, the present invention can produce high-quality waveforms, taking various styles of rendition (or various kinds of articulation) into account, without inducing tone color deterioration, undesired noise, etc.

Further, the present invention is characterized by synthesizing together harmonic and nonharmonic components' waveforms while synchronizing their respective waveform data at each predetermined position in their nonsteady state portions (characteristic waveform block segments), such as attack, release and joint portions, presenting complicated waveform variations. With this arrangement, the present invention can effectively prevent a difference in waveform synthesis timing between the harmonic and nonharmonic components' waveforms in each of the nonsteady state portions. Thus, the present invention can reliably prevent tone color deterioration, undesired noise, etc. and thus achieves the superior benefit that it can produce high-quality waveforms.

The present invention relates to the subject matter of Japanese Patent Application Nos. 2001-277994 and 2001-374014 filed Sep. 13, 2001 and Dec. 7, 2001, respectively, disclosure of which is expressly incorporated herein by reference in its entirety.

What is claimed is:

1. A waveform producing apparatus comprising:

a storage device storing a plurality of sets of waveform data, each of the sets of waveform data including a waveform to be read out along a time axis and a plurality of cycle synchronizing points in correspondence with predetermined points along the time axis of said waveform, said waveform included in each of the sets of waveform data being a waveform varying over time, said plurality of cycle synchronizing points being indicative of periodic specific phase positions where the one set of waveform data should be synchronized in phase with another of the sets of waveform data; and a processor coupled with said storage device and adapted to:

read out, along a time axis, at least two of the sets of waveform data from said storage device, wherein when waveform data of one of the at least two sets of waveform data is read out at any one of said predetermined points, corresponding one of said plurality of cycle synchronizing points is read out from said storage device, control readout of at least one of the at least two sets of waveform data on the basis of the cycle synchronizing point read out from said storage device in such a manner that respective readout locations of the at least two sets of waveform data are synchronized with each other at least at the specific phase position indicated by the cycle synchronizing point, and synthesize a tone waveform by combining the at least two sets of waveform data read out from said storage device under control of said processor.

2. A waveform producing apparatus as claimed in claim 1 wherein said storage device stores a set of waveform data representing a harmonic component of a predetermined waveform and a set of waveform data representing a nonharmonic component of the predetermined waveform, and said processor reads out the waveform data representing the harmonic component of the predetermined waveform and also reads out the waveform data representing the nonharmonic component of the predetermined waveform to be combined with the waveform data representing the harmonic component.

3. A waveform producing apparatus as claimed in claim 2 wherein the specific phase positions indicated by the plurality of cycle synchronizing points are positions determined in accordance with wave cycles of the waveform data representing the harmonic component of the predetermined waveform.

4. A waveform producing apparatus as claimed in claim 2 wherein said processor controls readout of the waveform data representing the nonharmonic component of the predetermined waveform so that a phase position indicated by the cycle synchronizing point of the waveform data representing the nonharmonic component is synchronized with a phase position indicated by the cycle synchronizing point read out in correspondence with readout of the waveform data representing the harmonic component.

5. A waveform producing apparatus as claimed in claim 1 wherein for the at least one of the at least two sets of waveform data to be read out from said storage device, said processor causes a virtual readout location, for reading out the waveform data of the at least one of the at least two sets from said storage device, to progress with passage of time, and specifies, on the basis of the virtual readout location, an actual readout location for reading out the waveform data of the at least one of the at least two sets from said storage device, and wherein said processor performs control to allow the actual readout location to be specified by shifting the virtual readout location of the waveform data of the at least one of the at least two sets in such a manner that a phase position indicated by the cycle synchronizing point of the at least one of the at least two sets is synchronized with the specific phase position indicated by the cycle synchronizing point of other of the at least two sets.

6. A waveform producing apparatus as claimed in claim 5 wherein said processor performs control to allow the actual readout location to be specified by shifting the virtual readout location of the at least one of the at least two sets back to a phase position indicated by the cycle synchronizing point of the at least one set that is set immediately before said virtual readout location.

7. A waveform producing apparatus as claimed in claim 1 wherein said processor performs control to change a readout location of the waveform data, to be read out from said storage device, of other of the at least two sets in such a manner that a phase position indicated by the cycle synchronizing point of the other of the at least two sets is synchronized with a phase position indicated by the cycle synchronizing point read out in correspondence with the one of the at least two sets.

8. A waveform producing apparatus as claimed in claim 1 wherein the periodic specific phase positions to be indicated by the plurality of cycle synchronizing points have cycles that correspond in number to an integral multiple of wave cycles of the waveform data.

9. A waveform producing apparatus as claimed in claim 1 wherein the at least one of the at least two sets of waveform data stored in said storage device has a predetermined waveform data section that is adapted to be read out repeatedly from said storage device.

10. A method for producing a waveform by use of a storage device storing waveform data, said storage device storing a plurality of sets of waveform data, each of the sets of waveform data including a waveform to be read out along a time axis and a plurality of cycle synchronizing points in correspondence with predetermined points along the time axis of said waveform, said waveform included in each of the sets of waveform data being a waveform varying over time, said plurality of cycle synchronizing points being indicative of periodic specific phase positions where the one set of waveform data should be synchronized in phase with another of the sets of waveform data, said method comprising:

a readout step of reading out, along a time axis, at least two of the sets of waveform data from said storage means, wherein when waveform data of one of the at least two sets of waveform data is read out at any one of said predetermined points, corresponding one of said plurality of cycle synchronizing points is read out from said storage device;

a control step of controlling readout, by said readout step, of at least one of the at least two sets of waveform data on the basis of the cycle synchronizing point read out by said readout step in such a manner that respective readout locations of the at least two sets of waveform data are synchronized with each other at least at the specific phase position indicated by the cycle synchronizing point; and synthesizing a tone waveform by combining the at least two sets of waveform data read out by said readout step under control of said control step.

11. A waveform producing apparatus comprising:

a storage device storing a plurality of blocks of waveform data, each of the blocks of waveform data, including at least a waveform to be read out along a time axis and a plurality of synchronizing points in correspondence with predetermined points along the time axis of said waveform, said waveform included in each of the sets of waveform data being a waveform varying over time, said plurality of synchronizing points being indicative of a specific position where the one block should be synchronized with another of the blocks; and a processor coupled with said storage device and adapted to:

read out, along a time axis, at least two of the blocks of waveform data from said storage device in a parallel fashion, wherein when waveform data of one of the at least two blocks of waveform data is read out at any one of said predetermined points, corresponding one of said plurality of synchronizing points is read out from said storage device, control readout of at least one of the at least two blocks of waveform data on the basis of the synchronizing point read out from said storage device in such a manner that respective readout locations of the at least two blocks of waveform data to be read out in parallel are synchronized with each other at least at the specific position indicated by the read-out synchronizing point, and synthesizing a tone waveform combining the at least two blocks of waveform data read out from said storage device under control of said processor, wherein said storage device stores blocks of waveform data of a plurality of types, and said processor reads out the blocks of waveform data of at least two of the types in a parallel fashion, and wherein said plurality of types include a type corresponding to a harmonic component of a waveform and a type corresponding to a nonharmonic component of the waveform.

12. A waveform producing apparatus as claimed in claim 11 wherein said processor reads out two or more blocks of waveform data from said storage device through a first channel while sequentially combining the two or more blocks in a time-serial manner, and, in parallel to readout through said first channel, said processor reads out two or more other blocks of waveform data from said storage device through a second channel while sequentially combining the two or more other blocks in a time-serial manner.

13. A waveform producing apparatus as claimed in claim 11 wherein said processor controls readout of at least one of the at least two blocks of waveform data, at the specific position indicated by the synchronizing position information, so that said at least one of the at least two blocks of waveform data is read out while being subjected to the cross-fade synthesis within a predetermined range including the specific position.

14. A waveform producing apparatus comprising:

a storage device storing a plurality of blocks of waveform data, for each of a harmonic component composed of a periodic waveform component and a nonharmonic component composed of a nonperiodic waveform component, each of the blocks of waveform data including at least a waveform to be read out along a time axis and a plurality of synchronizing points in correspondence with predetermined points along the time axis of said waveform, said waveform included in each of the sets of waveform data being a waveform varying over time, said plurality of synchronizing points being indicative of a specific position where respective blocks of the harmonic component and nonharmonic component corresponding to the harmonic component should be synchronized with each other; and a processor coupled with said storage device and adapted to:

read out, along a time axis, respective blocks of the harmonic component and corresponding nonharmonic component in a parallel fashion, wherein when waveform data of one of the at least two blocks of waveform data is read out at any one of said predetermined points, corresponding one of said plurality of synchronizing points is read out from said storage device, control readout of the block of waveform data of the nonharmonic component, on the basis of the synchronizing point for the block of the harmonic component read out from said storage device, in such a manner that a readout location of the block of the nonharmonic component to be read out in parallel to the block of the harmonic component is synchronized with a corresponding readout location of the block of the harmonic component at least at the specific position indicated by the read-out synchronizing point, and synthesize a tone waveform by combining the at least two blocks of waveform data read out from said storage device under control of said processor.

15. A waveform producing apparatus as claimed in claim 14 wherein the synchronizing position information is predetermined position information that is related to the beginning of a time period when the block of the harmonic component and the block of the harmonic component are to be read out in overlapping relation to each other.

16. A method for producing a waveform by use of a storage device storing waveform data, said storage device storing a plurality of blocks of waveform data, each of the blocks of waveform data, including at least a waveform to be read out along a time axis and a plurality of synchronizing points in correspondence with predetermined points along the time axis of said waveform, said waveform included in each of the sets of waveform data being a waveform varying over time, said plurality of synchronizing points being indicative of a specific position where the one block should be synchronized with another of the blocks, said method comprising:

a readout step of reading out, along a time axis, at least two of the blocks of waveform data from said storage device in a parallel fashion, wherein when waveform data of one of the at least two sets of waveform data is read out at any one of said predetermined points, corresponding one of said plurality of synchronizing points is read out from said storage device;

a control step of controlling readout, by said readout step, of at least one of the at least two blocks of waveform data on the basis of the synchronizing point read out by said readout step in such a manner that respective readout locations of the at least two blocks of waveform data are synchronized with each other at least at the specific position indicated by the read-out synchronizing point; and synthesizing a tone waveform by combining the at least two blocks of waveform data read out by said readout step under control of said control step, wherein said storage device stores blocks of waveform data of a plurality of types, and said processor reads out the blocks of waveform data of at least two of the types in a parallel fashion, and wherein said plurality of types include a type corresponding to a harmonic component of a waveform and a type corresponding to a nonharmonic component of the waveform.

17. A method for producing a waveform by use of a storage device storing a plurality of blocks of waveform data, to be read out along a time axis, for each of a harmonic component composed of a periodic waveform component and a nonharmonic component composed of a nonperiodic waveform component, each of the blocks of waveform data, including at least a waveform to be read out along a time axis and a plurality of synchronizing points in correspondence with predetermined points along the time axis of said waveform, said waveform included in each of the sets of waveform data being a waveform varying over time, said plurality of synchronizing points being indicative of a specific position where respective blocks of the harmonic component and nonharmonic component corresponding to the harmonic component should be synchronized with each other, said method comprising;

a readout step of reading out, along a time axis, respective blocks of the harmonic component and corresponding nonharmonic component in a parallel fashion, wherein when waveform data of one of the at least two sets of waveform data is read out at any one of said predetermined points, corresponding one of said plurality of synchronizing points is read out from said storage device;

a control step of controlling readout, by said readout step, of the block of waveform data of the nonharmonic component, on the basis of the synchronizing point for the block of the harmonic component read out by said readout step, in such a manner that a readout location of the block of the nonharmonic component to be read out in parallel to the block of the harmonic component is synchronized with a corresponding readout location of the block of the harmonic component at least at the specific position indicated by the synchronizing point; and synthesizing a tone waveform by combining the at least two blocks of waveform data read out by said readout step under control of said control step.

18. A computer readable medium comprising computer program code means for causing a computer to perform all the steps of claim 10.

19. A computer readable medium comprising computer program code means for causing a computer to perform all the steps of claim 16.

20. A computer readable medium comprising computer program code means for causing a computer to perform all the steps of claim 17.

* * * * *